(12) United States Patent
Islam et al.

(10) Patent No.: US 7,208,094 B2
(45) Date of Patent: Apr. 24, 2007

(54) METHODS OF BRIDGING LATERAL NANOWIRES AND DEVICE USING SAME

(75) Inventors: M. Saif Islam, Mountain View, CA (US); Theodore I. Kamins, Palo Alto, CA (US); Shashank Sharma, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 207 days.

(21) Appl. No.: 10/738,176

(22) Filed: Dec. 17, 2003

(65) Prior Publication Data

US 2005/0133476 A1    Jun. 23, 2005

(51) Int. Cl.
C23F 1/00      (2006.01)
H01L 21/00     (2006.01)

(52) U.S. Cl. ............... 216/2; 216/41; 117/2; 117/84; 977/721; 977/742

(58) Field of Classification Search ............ 216/2, 216/41; 117/2, 84; 438/689, 694; 977/721, 977/742
See application file for complete search history.

(56) References Cited

U.S. PATENT DOCUMENTS

| | | | |
|---|---|---|---|
| 6,297,063 B1 | 10/2001 | Brown et al. | |
| 6,791,338 B1* | 9/2004 | Bratkovski et al. | 324/600 |
| 6,841,142 B1* | 1/2005 | Tenne et al. | 423/509 |
| 2002/0014667 A1 | 2/2002 | Shin et al. | |
| 2002/0117659 A1 | 8/2002 | Lieber et al. | |
| 2003/0165418 A1 | 9/2003 | Ajayan et al. | |
| 2004/0075464 A1* | 4/2004 | Samuelson et al. | 326/37 |
| 2004/0079278 A1* | 4/2004 | Kamins et al. | 117/84 |
| 2004/0175844 A1* | 9/2004 | Yang et al. | 438/2 |
| 2005/0011431 A1* | 1/2005 | Samuelson et al. | 117/40 |

FOREIGN PATENT DOCUMENTS

| | | |
|---|---|---|
| EP | 1018758 | 7/2000 |
| WO | WO 01/44796 | 6/2001 |
| WO | WO 03/052181 | 6/2003 |

OTHER PUBLICATIONS

K. Haraguchi, K. Hiruma, T. Katsuyama, K. Tominaga, M. Shirai, and T. Shimada, "Self-organized fabrication of planar GaAs nanowhisker arrays," Appl. Phys. Lett., vol. 69, pp. 386-387 (Jul. 15, 1996).

(Continued)

*Primary Examiner*—Shamim Ahmed

(57) ABSTRACT

A semiconductor nanowire is grown laterally. A method of growing the nanowire forms a vertical surface on a substrate, and activates the vertical surface with a nanoparticle catalyst. A method of laterally bridging the nanowire grows the nanowire from the activated vertical surface to connect to an opposite vertical surface on the substrate. A method of connecting electrodes of a semiconductor device grows the nanowire from an activated device electrode to an opposing device electrode. A method of bridging semiconductor nanowires grows nanowires between an electrode pair in opposing lateral directions. A method of self-assembling the nanowire bridges the nanowire between an activated electrode pair. A method of controlling nanowire growth forms a surface irregularity in the vertical surface. An electronic device includes a laterally grown nano-scale interconnection.

48 Claims, 9 Drawing Sheets

OTHER PUBLICATIONS

T. Shimada, K. Hiruma, M. Shirai, M. Yazawa, K. Haraguchi. T. Sato, M. Matsui, and T. Katsuyama, "Size, position and direction control on GaAs and InAs nanowhisker growth," Superlattices and Microstructures, vol. 24, pp. 453-458 (1998).

K. Haraguchi, K. Hiruma, K. Hosomi, M. Shirai, and T. Katsuyama, "Growth mechanism of planar-type GaAs nanowhiskers," J. Vac. Sci. Technol. B, vol. 15, pp. 1685-1687 (Sep./Oct. 1997).

A. Tilke, R.H. Blick, H. Lorenz, J.P. Kotthaus and D.A. Wharam, "Coulomb blockade in quasimetallic silicon-on-insulator nanowires", Applied Physics Letters, vol. 75, No. 23, Dec. 6, 1999, pp. 3704-3706.

A.T. Tilke, F.C. Simmel, H. Lorenz, R.H. Blick and J. P. Kotthaus, "Quantum intererence in a one-dimensional silicon nanowire", Physical Review B, vol. 68, 075311 (2003), pp. 075311-1 to 075311-6.

Yi Cui and Charles M. Lieber, "Functional Nanoscale Electronic Devices Assembled Using Silicon Nanowire Building Blocks", Science, vol. 291, Feb. 2, 2001, pp. 851-853.

Westwater, J et al—"Growth of Silicon Nanowires Via Au-Silane VLS Reaction"—Journal of Vacuum Science and Technology Part B—vol. 15 No. 3 May 1995—pp. 554-557.

* cited by examiner

METHODS OF BRIDGING LATERAL NANOWIRES AND DEVICE USING SAME

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA972-01-3-0005 awarded by the Defense Advanced Research Projects Agency.

BACKGROUND

1. Technical Field

The invention relates to nano-scale semiconductor devices and fabrication methods therefor. In particular, the invention relates to fabrication and use of nanowires in semiconductor devices.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having dimensions that are often 50 to 100 times smaller than conventional semiconductor structures. Among the most promising of the nano-scale structures are nanowires.

Nanowires are wire-like structures on the order of 1–100 nm in diameter. In addition to functioning as conventional wires for interconnection applications, nanowires have a wide variety of other potential applications. In particular, nanowires can exhibit essentially 1-dimensional current flow properties and other related quantum effects that may be useful in certain sensor-related applications.

While holding much promise, the practical application of nanowires has been somewhat limited. In particular, it has proved difficult to provide nanowires, especially laterally grown nanowires that can be fabricated in production quantities for a reasonable cost. In addition, growing nanowires, especially arrays of nanowires, in a controlled manner has often proved an elusive goal.

Accordingly, it would be desirable to grow and interconnect lateral nanowires in semiconductor devices using commercially oriented, potentially low-cost, fabrication techniques. Such laterally grown nanowires would solve a long-standing need in the area of nanotechnology.

BRIEF SUMMARY

In some embodiments of the present invention, a method of connecting electrodes of a semiconductor device with a semiconductor nanowire is provided. The method of connecting comprises activating a semiconductor electrode with a nanoparticle catalyst. The activated electrode has a vertical surface that is a (111) semiconductor lattice plane. The vertical surface comprises the nanoparticle catalyst. The method of connecting further comprises growing a semiconductor nanowire from the vertical surface laterally to an opposing electrode of the semiconductor device. The opposing semiconductor electrode is spaced from the activated electrode and has a vertical surface that opposes the activated electrode vertical surface. A free end of the growing nanowire mechanically connects to the opposing vertical surface.

In other embodiments of the present invention, an electronic device having a nano-scale interconnection is provided. The electronic device comprises a pair of spaced apart semiconductor electrodes supported by a substrate. Each electrode has an opposing vertical surface. The vertical surfaces are (111) semiconductor lattice planes and comprise a nanoparticle catalyst. The electronic device further comprises a semiconductor nanowire laterally bridging the pair of electrodes. The nanowire bridges between the opposing vertical surfaces. The laterally bridging semiconductor nanowire interconnects the electrode pair.

In still other embodiments of the present invention, a method of growing a nanowire in a lateral direction, a method of controlling nanowire growth, a method of laterally bridging a nanowire, and methods of bridging and self-assembling a nanowire between electrodes of a device are provided.

Certain embodiments of the present invention have other features in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
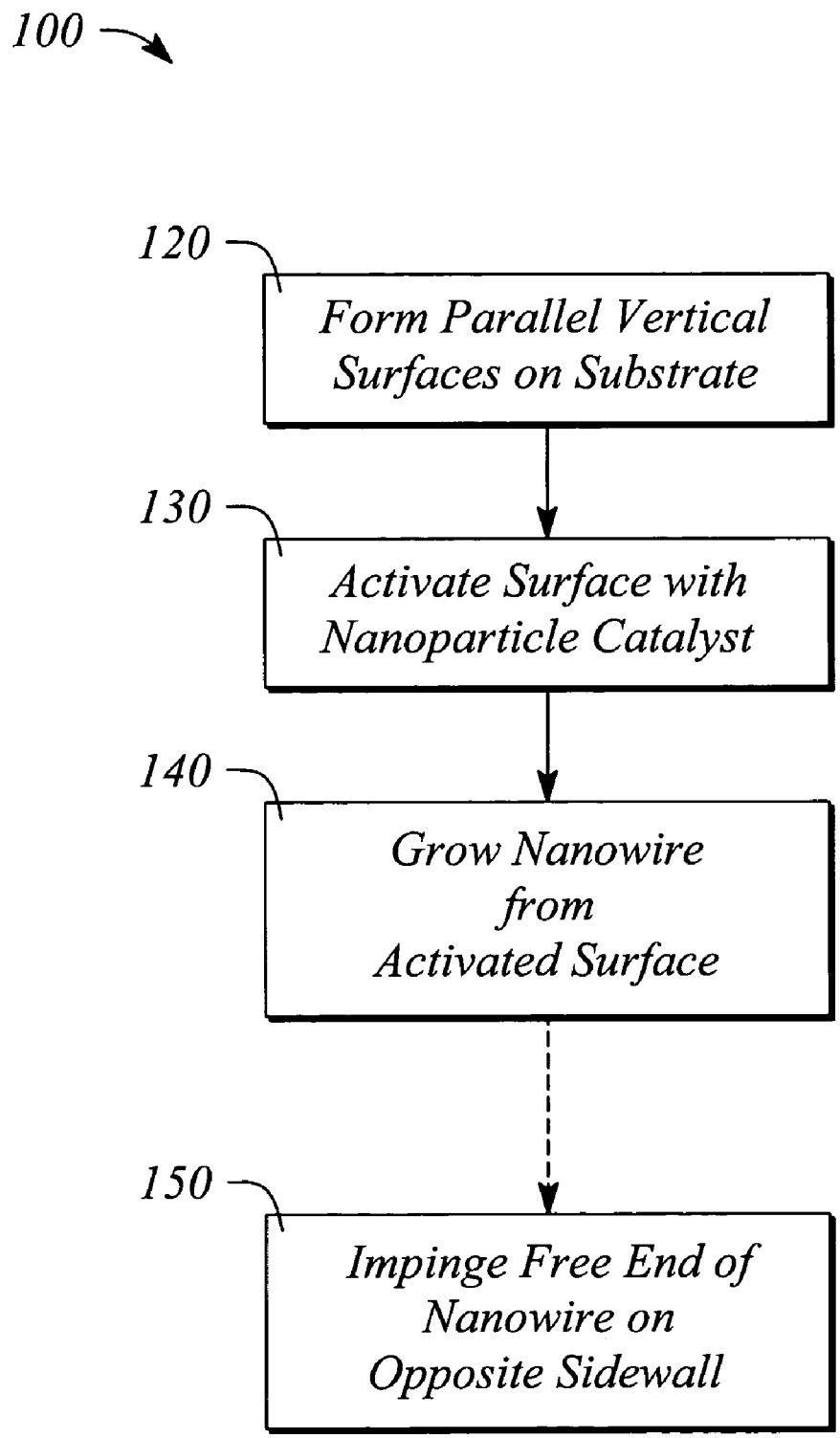
FIG. 1 illustrates a flow chart of an embodiment of a method of growing a nanowire in a lateral direction according to an embodiment of the present invention.

Embodiments of the present invention facilitate lateral growth of semiconductor nanowires. Such laterally grown nanowires are essentially horizontal or parallel with respect to a horizontally oriented surface of a substrate or wafer associated with the nanowires. In some embodiments, the laterally grown nanowires are highly oriented, metal-catalyzed nanowires grown from vertical planes. A nanowire may grow at an angle to the vertical plane, such as for example, approximately perpendicular thereto. The laterally grown nanowires may bridge or connect separate regions of the substrate according to some embodiments. Moreover, such bridging nanowires may interconnect isolated structural elements of the substrate, where the elements are or can be further developed into electrodes or other circuit elements. In other embodiments, arrays of laterally grown nanowires that interconnect between opposing vertical surfaces are provided. Interconnecting nanowire arrays, some embodiments of which are dense arrays, may include nanowires resulting from one or more of primary, secondary and tertiary growth. In other embodiments, arrays of laterally grown nanowires that extend from a vertical surface and do not interconnect an opposing vertical surface are provided.

Among other things, various embodiments of laterally grown semiconductor nanowires may be useful for realizing reproducible, mass-fabrication of dense, low-cost individual nanowires and/or nanowire arrays for device applications (e.g., sensors, self assembling networks, etc.) as well as for nanowire characterization. For example, laterally grown nanowires may provide a massively parallel, self-assembly technique for connecting nanostructures between electrodes using only relatively coarse lithography. In another example, dense arrays of large numbers of laterally grown nanowire bridges may provide a high surface to volume ratio useful for sensor applications.

Semiconductor nanowires comprise a semiconductor material including, but not limited to, an element from group IV of the Periodic Table of the Elements; two different elements from group IV; an element from group III with an element from group V; and an element from group II with an element from group VI. For example, and not by way of limitation, any one of silicon (Si), germanium (Ge), silicon carbide (SiC), gallium arsenide (GaAs), gallium nitride (GaN), gallium phosphide (GaP), indium phosphide (InP), indium arsenide (InAs), aluminum nitride (AlN), zinc oxide (ZnO), and cadmium sulfide (CdS) may be used as the material of a semiconductor nanowire. The semiconductor materials useful for nanowires have characteristic properties that impart different electrical, quantum, chemical and/or physical results. A semiconductor nanowire can be grown such that one or more of length, diameter, shape, direction of growth, and position of the semiconductor nanowire are controlled in accordance with some embodiments of the present invention. Moreover, nanowires may be grown from a semiconductor substrate or device substrate. The substrate material comprises one or more semiconductor materials that may include, but is not limited to, the list of nanowire materials from above.

For example, a silicon nanowire is a semiconductor nanowire comprising Si. The semiconductor nanowire may be a single crystal of Si, or may comprise a controlled boundary at a given position along the nanowire during growth, such as a heterojunction, for example, to control electronic properties of the nanowire. Silicon nanowires grow in a direction that is nearly normal to a (111) plane of a crystal lattice. For example, a silicon nanowire can grow substantially perpendicular from a (111) surface of a semiconductor substrate or wafer made of Si or GaAs.

FIG. 1 illustrates a flow chart of an embodiment of a method 100 of growing a nanowire in a lateral direction from a vertical surface of a substrate. The nanowire comprises a semiconductor material selected from the materials described above. Moreover, the substrate comprises a semiconductor material selected from the materials described above. Depending on the embodiment, the semiconductor material of the nanowire either may be or may not be the same material or a similar material to the semiconductor material of the substrate.

In some embodiments, the substrate material is silicon (Si) cut or polished with the surface plane being a (110) crystal lattice plane. Such a substrate is referred to as a (110) oriented Si substrate. For the purposes of discussion herein, and not by way of limitation, the (110) plane is considered to be horizontally oriented with respect to the Cartesian coordinate system. The (110) oriented Si substrate further has (111) planes of the Si crystal lattice, at least some of which are approximately perpendicular to and intersect with the horizontally oriented (110) surface of the substrate. Further for the purposes of discussion herein, these intersecting (111) planes are referred to herein as vertically oriented (111) planes or surfaces, noting that the (111) planes are approximately vertically oriented relative to the horizontal (110) surface of the Si substrate.

In other embodiments, a (111) surface is oriented horizontally with respect to the Cartesian coordinate system. The vertical surfaces can be formed of an insulating material, such as $SiO_2$, in or on the substrate or formed of a crystal plane of the Si lattice, for example a (110) plane. Another (111) surface is oriented horizontally over the relatively vertically extending insulating layer or crystalline Si plane. In such embodiments, a nanowire that grows from the (111) surface will grow nearly normal to the (111) surface, but extend vertically instead of laterally relative to the Si surface plane.

Figure 2A:
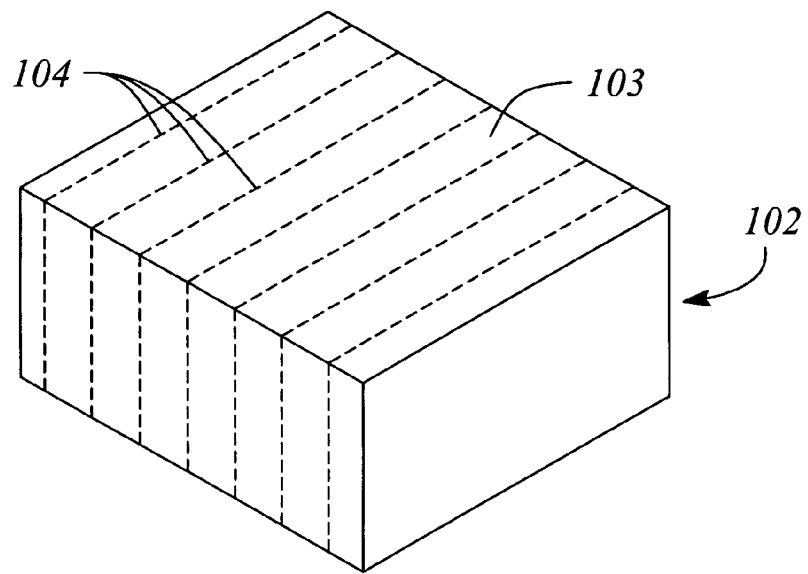
FIG. 2A illustrates a perspective view of an exemplary silicon (Si) substrate having an (110) orientation according to an embodiment of the present invention.

FIG. 2A illustrates a perspective view of an exemplary Si substrate 102 having an (110) orientation. A top surface 103 of the exemplary Si substrate 102 is a (110) plane of the Si crystal lattice. Individual ones of several (111) planes 104 are illustrated in FIG. 2A by dashed lines that define planes approximately perpendicular to the top surface 103.

As used herein, 'horizontal' generally refers to a direction or a plane that is parallel with a surface (e.g., top surface 103) of a substrate or wafer while 'vertical' generally refers to a direction or plane that is substantially or approximately perpendicular to the substrate surface. The specific use of the terms 'horizontal' and 'vertical' herein to describe relative characteristics is made solely to facilitate discussion and is not intended to introduce absolute limitations to the present invention. Similarly, reference to a 'top surface' of a substrate or wafer simply provides a means for discussion and is not meant to limit the present invention or any embodiments thereof described hereinbelow unless otherwise noted.

Referring again to FIG. 1, the method 100 of growing comprises forming 120 a vertical surface on or in a Si substrate or wafer. Forming 120 comprises further forming an opposing vertical surface. The so formed vertical surfaces are spaced apart, and oppose one another. Furthermore, the formed vertical surfaces are (111) lattice planes of the Si substrate. In some embodiments, the formed vertical surfaces are essentially parallel to each other.

Generally, a particular separation or spacing between the formed vertical surfaces is dependent on a given application or intended use of the substrate. Thus, in some embodiments, the spacing between vertical surfaces ranges from about 50 nm to about 1 millimeter (mm). In other embodiments, the spacing ranges from about 0.1 micron (μm) and about 100 μm. In still other embodiments, the spacing ranges from about 1 μm and about 20 μm. For example, the spacing may be approximately 10 μm in one particular application and approximately 2 μm in another. Alternatively, the spacing is about 8 μm or less in some embodiments.

Forming 120 may comprise any method of creating or producing vertical surfaces in a Si substrate including, but not limited to, any one or more of mechanical cutting, laser cutting, wet etching and dry etching the substrate provided that the method forms 120 vertical surfaces aligned with or coincident with one or more (111) planes. For example, forming 120 may comprise etching a trench in the Si substrate, where sidewalls of the trench are the vertical surfaces aligned with two (111) planes of the substrate.

In some embodiments, forming 120 parallel vertical surfaces comprises depositing and/or growing an oxide layer on the top surface of the (110) Si wafer. For example, a thermal oxide layer may be grown on the top surface. Once deposited or grown, the oxide layer is patterned to serve as an etch mask for subsequent etching. As used herein, 'patterning' or 'patterned' refers to defining and producing a final pattern, or a final pattern defined and produced, in the oxide layer, for example, and is not limited to any process used to so define and produce such a final pattern. Edges defined by patterning the oxide layer establish locations of the vertical surfaces that are being formed 120. In particular, edges of the mask are lying along or aligned with the intersection of one or more (111) planes of the Si substrate with the top surface.

Thus in some embodiments, the patterned oxide layer and edges thereof essentially define a location of a trench to be formed 120 in the substrate 102, where the trench is bounded by two or more of the vertically oriented (111) planes or surfaces 104. Patterning the oxide layer may comprise any known technique including, but not limited to, conventional photolithography, imprint lithography and electron-beam lithography, along with an applied resist or similar masking material or masking process, or ion milling.

Figure 2B:
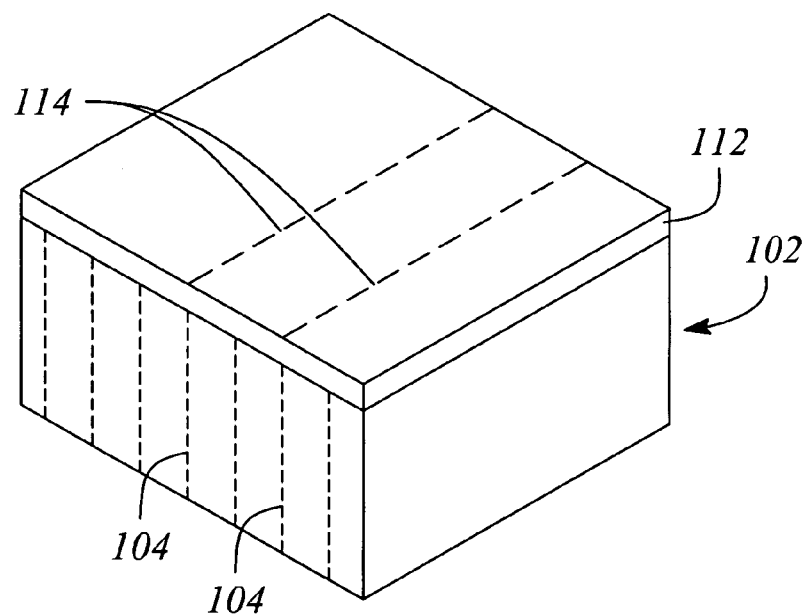
FIG. 2B illustrates a perspective view of the exemplary Si substrate of FIG. 2A having an oxide layer on the substrate according to an embodiment of the present invention.

FIG. 2B illustrates a perspective view of the exemplary Si substrate 102 of FIG. 2A having an oxide layer 112 on the substrate 102. A pair of dashed lines 114 is aligned with a pair of (111) planes 104 as illustrated in FIG. 2B. The dashed lines 114 represent a pattern to be formed in the oxide layer 112 using any of the above-mentioned techniques.

With patterning, a portion of the oxide layer 112 is removed by one or both of reactive ion etching (RIE) and wet chemical etching, for example. Selective removal of portions of the oxide layer 112 exposes selected portions of the underlying top surface 103 of the Si substrate 102 while leaving other portions unexposed. The selected exposed and unexposed portions are defined by the aligned patterned edges of the etched oxide layer 112. The patterned oxide layer 112 essentially forms an etch mask for later processing of the Si substrate 102.

As used herein, 'etching' generally refers to any process by which material is removed either selectively or nonselectively. Thus, 'oxide etching' refers to any process that removes oxide of the oxide layer 112. In some embodiments, dry chemical processing such as, but not limited to, using plasmas or ion beams, may be employed to etch the oxide layer 112. Moreover, patterning described hereinabove determines the locations of the oxide etching.

For example, reactive ion etching (RIE) may be employed to selectively etch the oxide layer 112. RIE is a specialized plasma dry chemical processing that is known to achieve anisotropic material removal. In another example, various plasmas can be used with an unbiased substrate to produce generally isotropic etching of the oxide layer 112. In yet another example, ion milling may be used to etch the oxide layer 112. Ion milling is a form of ion beam dry chemical processing that is inherently anisotropic. See for example, *High-Speed Semiconductor Devices,* Edited by S. M. Sze, A Wiley-Interscience Publication, John Wiley & Sons, Inc., 1990, at least Part I, Section 1.4, pp 33–51, at pg. 49.

Figure 2C:
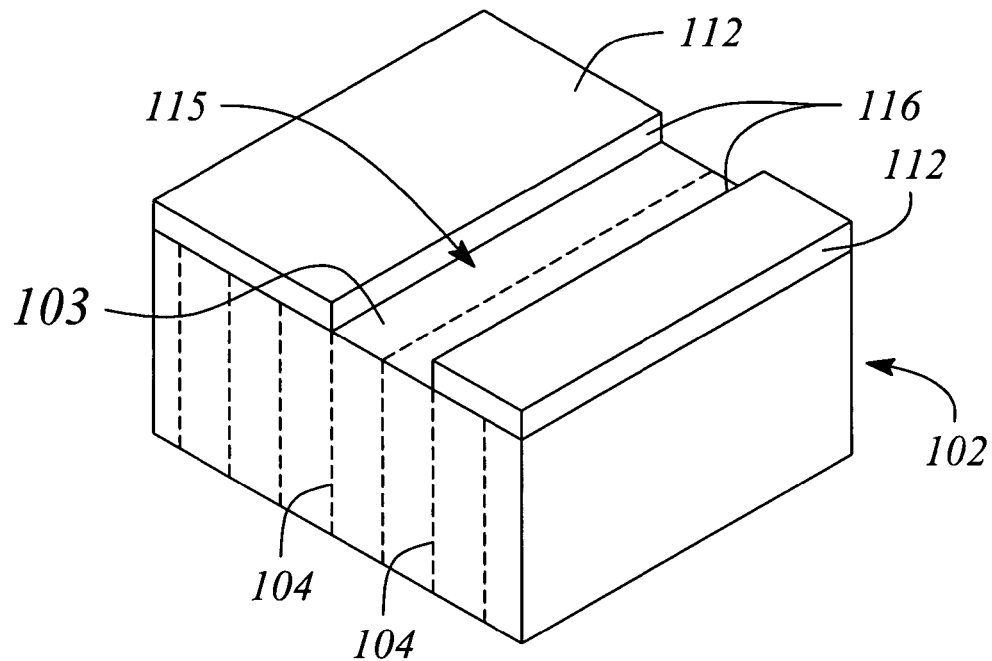
FIG. 2C illustrates a perspective view of the exemplary Si substrate of FIG. 2B in which the oxide layer is patterned to expose a portion of the underlying top surface according to an embodiment of the present invention.

FIG. 2C illustrates a perspective view of the exemplary Si substrate 102 of FIG. 2B in which the oxide layer 112 is patterned to expose a portion 115 of the underlying top surface 103 of the Si substrate 102. Edges 116 of the patterned oxide layer 112 that bound the exposed portion 115 of the top surface 103 coincide with intersections of the (111) planes 104 with the top surface 103 of the substrate 102.

Forming 120 parallel vertical surfaces further comprises anisotropically etching the silicon using the patterned thermal oxide layer 112 as an etch mask. Silicon etching may be accomplished by exposing the Si substrate to an etching solution such as a potassium hydroxide (KOH) solution or an ethylene diamine pyrocatechcol (EDP) solution, for example. Exposure to such etching solutions removes Si material anisotropically to create grooves or trenches in the Si substrate as defined by the etch mask. The target depth is achieved by adjusting the etching time along with solution concentration and temperature.

Etching solutions such as KOH or EDP, as well as some other chemicals, attack or etch (111) planes in the Si substrate as much as one hundred times more slowly than they etch other planes, e.g., the (110) planes. As such, relatively deep narrow trenches can be produced with depth-to-width aspect ratios of almost 100:1 when etching the (110) Si substrate through the patterned oxide layer 112 etch mask. Again see *High-Speed Semiconductor Devices,* cited supra at pg. 47. With the alignment of the edges 116 of the patterned oxide etch mask coinciding with (111) planes of the Si substrate, anisotropically etched grooves or trenches so formed 120 are bounded by the opposing vertical surfaces having the exposed vertical (111) planes.

Figure 2D:
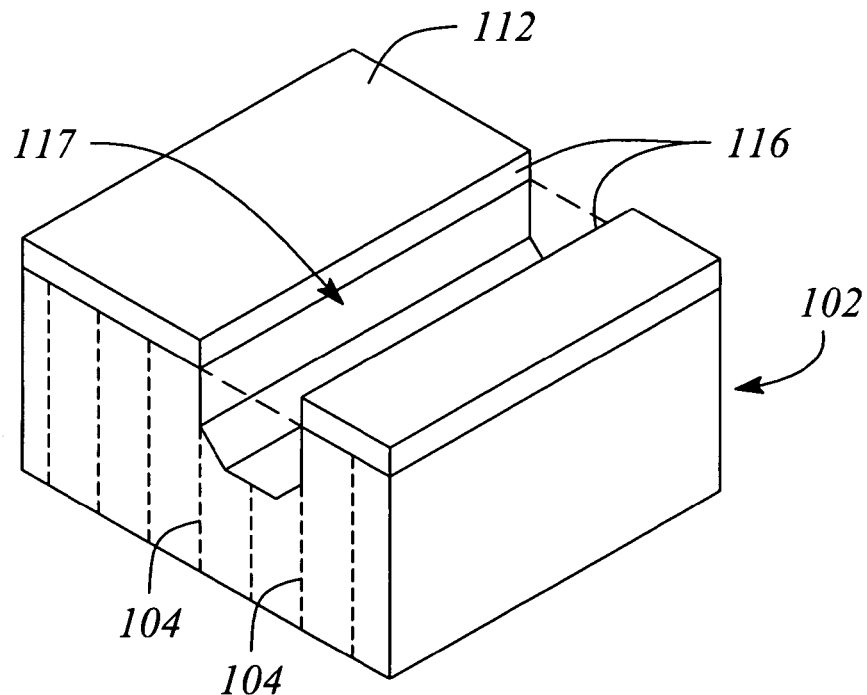
FIG. 2D illustrates a perspective view of the exemplary Si substrate of FIG. 2C during etching with a KOH solution according to an embodiment of the present invention.
Figure 2E:
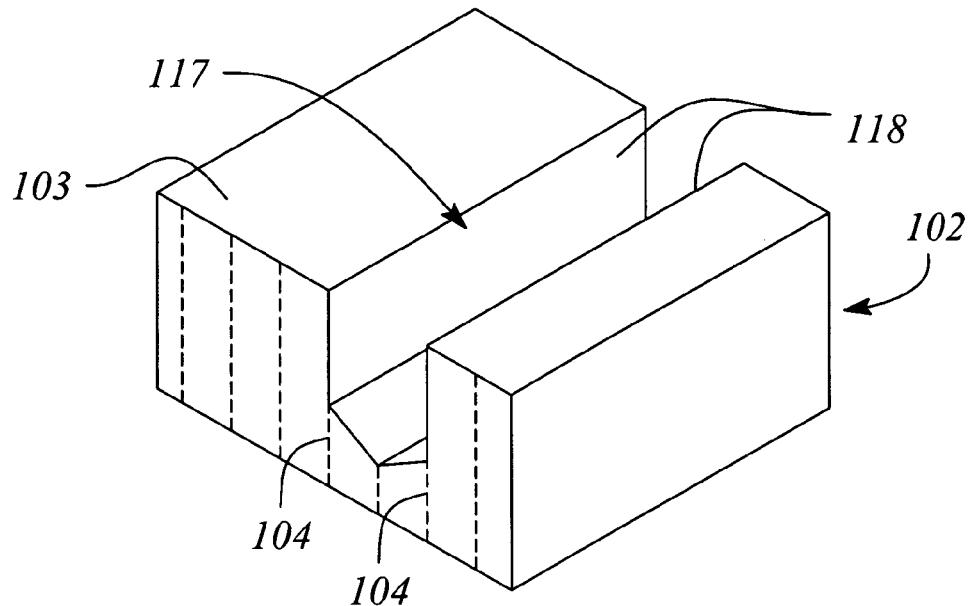
FIG. 2E illustrates a perspective view of the exemplary Si substrate of FIG. 2D at a completion of KOH etching according to an embodiment of the present invention.

FIG. 2D illustrates a perspective view of the exemplary Si substrate 102 of FIG. 2C during etching with a KOH solution. FIG. 2E illustrates a perspective view of the exemplary Si substrate 102 of FIG. 2D at a completion of KOH etching. FIG. 2D illustrates a shape of the bottom end of the trench that includes angled surfaces and a partially horizontal surface during etching, by way of example only and not by limitation. FIG. 2E illustrates a formed trench 117 having parallel, opposing sidewalls 118. Moreover, the sidewalls 118 are the parallel or opposing vertical surfaces that coincide with (111) planes 104 of the Si substrate 102. Further, FIG. 2E illustrates the trench bottom with a generally V shape by way of example only and not by limitation. The trench bottom may take on other shapes depending on at least the width of the trench being etched and the method of etching. For example, the trench bottom may have a generally horizontal portion between the angled portions of the V-shape of the trench bottom in some embodiments, during and/or after trench formation. Moreover in some embodiments, the formed trench 117 may have a U shape. As such, the illustrations are not intended to limit the scope of any embodiment herein.

Referring to FIG. 1 once again, the method 100 of growing further comprises activating 130 a first of the opposing vertical surfaces with a nanoparticle catalyst. In some embodiments, activating 130 comprises depositing the nanoparticle catalyst directly onto the first vertical surface. In other embodiments, activating 130 comprises depositing a catalyst material onto the first vertical surface, and annealing the catalyst material to form the nanoparticle catalyst.

The nanoparticle catalyst or the catalyst material may be deposited by a deposition technique including, but not limited to, one or more of physical vapor deposition and chemical vapor deposition. Thermal evaporation, electron-beam evaporation and sputtering are physical vapor deposition techniques, for example. The nanoparticle catalyst or catalyst material is deposited to an average thickness ranging from about 0.01 nanometers (nm) to about 100 nm. At a thickness around the lower range of about 0.01 nm, the deposited layer is discontinuous and the thicknesses averaged over the entire surface is about 0.01 nm, while the deposited layer may be locally thicker. In some embodiments, the catalyst material is deposited to a thickness ranging from about 0.1 nm to about 5 nm. Typical nucleating catalyst materials include, but are not limited to metals, such as titanium (Ti), gold (Au), iron (Fe), cobalt (Co), gallium (Ga), and alloys thereof, and nonmetals, such as $SiO_x$, where x ranges from about 1 to less than 2, for example. Typical nanoparticle catalysts corresponding to Ti and Au catalyst materials, for example, are respectively $TiSi_2$ and a Au—Si alloy.

In some embodiments, depositing the nanoparticle catalyst or the catalyst material employs preferential deposition. Preferential deposition deposits the nanoparticle catalyst or the catalyst material in a preferential manner. For example, preferential deposition may be employed to deposit catalyst material on one of the sidewalls of a trench to the exclusion of the other. In another example, preferential deposition may be employed to deposit catalyst material in local, discrete regions of a sidewall. By employing preferential deposition of the nanoparticle catalyst or the catalyst material, a starting location of a subsequently grown nanowire may be controlled. For example, nanowires may be controlled to grow from a selected sidewall of the trench by preferentially depositing catalyst material only on the selected sidewall.

Preferential deposition includes, but is not limited to, angled deposition. In angled deposition, the Si substrate is angled with respect to a source of flow of the nanoparticle catalyst or the catalyst material or vice versa during deposition. As a result, angled deposition provides for deposition of the nanoparticle catalyst or the catalyst material on substantially only a first vertical surface of the trench to the approximate exclusion of depositing on a second, opposing vertical surface. Moreover, angled deposition may provide for deposition on all or a portion of the first vertical surface. Generally, angles of between about 5° and about 85°, or angles less than about 90°, depending on the embodiment, may be used in angled deposition. However, a determination of a particular angle depends on one or more of the method of deposition, a desired amount of exclusion, the dimensions of the trench, and a particular nanoparticle catalyst or a particular catalyst material being deposited.

For example, the Si substrate may be held at an angle of approximately 45° with respect to a deposition direction. At an approximate 45° angle, the nanoparticle catalyst or the catalyst material is deposited preferentially on an upper portion of the first vertical surface of a groove or trench, where the trench dimensions were approximately 6 µm wide by approximately 8 µm deep. Little or no nanoparticle catalyst or catalyst material is deposited on the opposing vertical surface, the trench bottom, or the lower portion of the first vertical surface for the particular dimensions cited above due to a shadowing effect by the substrate surfaces.

Figure 2F:
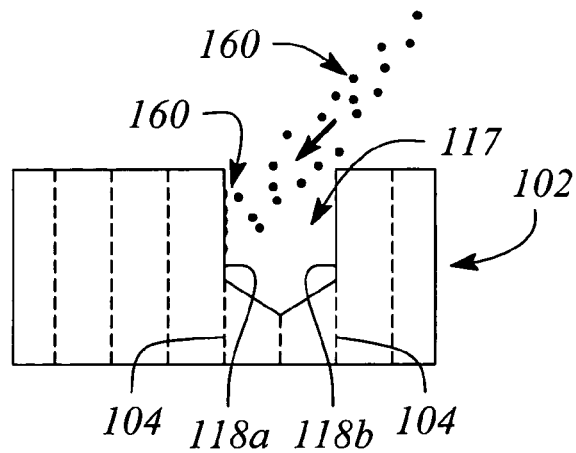
FIG. 2F illustrates side view of the exemplary Si substrate with a trench undergoing activation by preferential deposition of a nanoparticle catalyst or a catalyst material according to an embodiment of the present invention.

FIG. 2F illustrates a side view of the exemplary Si substrate 102 with a trench 117 surface undergoing activation 130 by preferential deposition of the nanoparticle catalyst or the catalyst material. As illustrated in FIG. 2F, angled deposition of the nanoparticle catalyst 160 or the catalyst material 160 is employed. In particular, the nanoparticle catalyst 160 or the catalyst material 160 is directed toward the substrate 102 at an angle of approximately 45°. Deposition occurs on a first sidewall or vertical surface 118*a* of the trench 117 while a second sidewall 118*b* and an approximate bottom of the trench are shadowed from deposition, and nuclei do not form on them relative to the first surface 118*a*.

In the embodiments that deposit the catalyst material, activating 130 further comprises annealing the deposited catalyst material to form the catalyst nanoparticle (i.e., the nanoparticle catalyst). In some embodiments, annealing is performed in a closed, controlled environment. A closed, controlled environment includes, but is not limited to, a reactor chamber of a material deposition system where at least temperature and pressure are selectively controlled. For example, a titanium (Ti) catalyst material may be annealed to reduce native oxide on the Ti and form the $TiSi_2$ nanoparticle. A gold (Au) catalyst material may be annealed to form the gold-silicon alloy (Au—Si) nanoparticle. Moreover, such material deposition systems include, but are not limited to, chemical vapor deposition (CVD) systems, metal organic vapor phase epitaxy (MOVPE) systems, resistance-heated-furnace diffusion/annealing systems, and rapid thermal processing (RTP) systems. In the embodiments that deposit the nanoparticle catalyst directly to the surface, annealing is optional during activating 130.

In some embodiments of the method 100, deposition of the nanoparticle catalyst or the catalyst material can be controlled. For example, a substrate structure with exposed vertical surfaces and passivated horizontal surfaces can be formed before activating 130. In one of these embodiments, forming 120 the vertical surfaces comprises etching the substrate to form the vertical surfaces, as described above. However, in this embodiment, forming 120 further comprises depositing a mask material, such as silicon nitride ($Si_3N_4$), on all surfaces of the etched substrate. Other non-oxidizing mask materials that can endure high temperature treatment alternatively may be used in this embodiment.

Once the mask material is deposited, forming 120 vertical surfaces further comprises selectively removing the mask material from only horizontal and nearly horizontal surfaces. For example, directional reactive-ion etching may be used to selectively remove the mask material. Such horizontal surfaces are exposed by the selective removal of the mask material.

Once the mask material is removed from the horizontal and nearly horizontal surfaces, forming 120 further comprises passivating the exposed horizontal surfaces to protect the horizontal surfaces. One form of passivating is growing an oxide layer on the horizontal surfaces. Once the horizontal surfaces are passivated, forming 120 further comprises removing the mask material from the vertical surfaces to expose the vertical surfaces. The mask material is removed from the vertical surfaces using an etching process that does not affect the passivation layer. Another form of passivating is selectively depositing the oxide layer on the horizontal surfaces. In some embodiments of selective deposition, the vertical surfaces need not be masked.

Further in this embodiment of forming 120, after the vertical surfaces are exposed, the vertical surfaces are activated 130. As described above, activating 130 comprises adding the nanoparticle catalyst or the catalyst material to the exposed vertical surfaces using a selective deposition process. As a result, the nanoparticle catalyst or the catalyst material can be selectively added to the exposed vertical surfaces while not forming on the passivated horizontal surfaces.

One selective deposition process is a selective CVD process. The selective CVD process deposits either the nanoparticle catalyst or the catalyst material only on exposed surfaces and does not deposit on regions where the surfaces are not exposed. For example, the selective CVD process may deposit Ti from $TiCl_4$ in some embodiments where the catalyst material is deposited and optionally annealed to form the nanoparticle catalyst.

A self-aligned silicide ("salicide") process is another selective deposition process. The salicide process deposits a silicide-forming material, such as a metal catalyst, on all surfaces of the substrate and anneals the silicide-forming material at an intermediate temperature. In regions with an exposed Si substrate surface, (i.e., the exposed vertical surfaces) the metal catalyst reacts with the exposed Si to form a silicide (for example, a Ti catalyst will form $TiSi_2$ upon reaction with the exposed Si surface). In regions where the Si substrate surface is protected (i.e., the passivated horizontal and nearly horizontal surfaces), the reaction does not occur. The unreacted metal is then removed from the protected regions by selective chemical etching, leaving silicide (i.e., the catalyst material) only on the regions where Si was exposed, namely the exposed vertical surfaces.

Again referring to FIG. 1, the method 100 of growing further comprises growing 140 a nanowire from the activated vertical surface. The nanowire preferentially grows in a direction toward a second of the vertical silicon surfaces.

Such a preferential growth direction is a result of the activated vertical surface coinciding with a (111) plane as described hereinabove. The preferential growth direction results in lateral growth of the nanowire.

Growing 140 comprises exposing the activated vertical surface to a controlled temperature, pressure and a gas containing a material of the nanowire to be grown.

For a silicon nanowire, a Si-containing gas is used. For another semiconductor nanowire, the gas contains the precursors for the respective other semiconductor material.

Figure 2G:
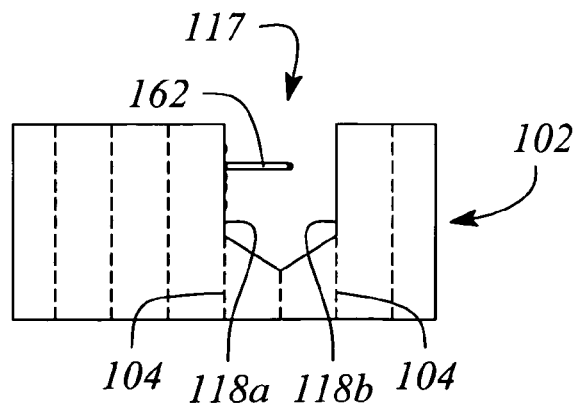
FIG. 2G illustrates a side view of the exemplary Si substrate depicting a nanowire growing from an activated sidewall of a trench according to an embodiment of the present invention.

FIG. 2G illustrates a side view of the exemplary Si substrate 102 depicting a nanowire 162 growing 140 from an activated sidewall of the trench 117. In particular, the nanowire 162 is growing 140 laterally from the first sidewall 118a of the trench 117 toward the second sidewall 118b.

In some embodiments, the activated vertical surface is exposed to the gas in the reactor chamber of the material deposition system. As such, the temperature and pressure are regulated, and the gas or a gas mixture is introduced and controlled during nanowire growth 140. For example, a silicon nanowire grown 140 using a CVD system and process may use a Si-containing gas, such as a gas mixture of silane ($SiH_4$) and hydrogen chloride (HCl) or a gas of dichlorosilane ($SiH_2Cl_2$) or silicon tetrachloride ($SiCl_4$) in a hydrogen ($H_2$) ambient, to grow the silicon nanowire from the nanoparticle catalyst.

Nanowire growth 140 is initiated when adatoms resulting from decomposition of the particular semiconductor material-containing gas diffuse through or around the 30 nanoparticle catalyst, and the adatoms precipitate on the underlying substrate. For example, for a silicon nanowire, growth 140 is initiated by diffusing silicon adatoms resulting from decomposition of the silicon-containing gas through or around the nanoparticle catalyst, and precipitating the silicon adatoms on the underlying substrate. Moreover, growth of the nanowire is continued with continued precipitation at the nanoparticle-nanowire interface. Such continued precipitation causes the nanoparticle to remain at the tip at the free end of the growing nanowire. For example, when using either a $TiSi_2$ or Au—Si alloy nanoparticle catalyst, an amount of the respective $TiSi_2$ or Au—Si alloy remains at the tip of the free end. The nanowire grows 140 epitaxially in a columnar shape adjacent to the nanoparticle and extends laterally from the vertical surface. The nanoparticle at the tip has a similar diameter to that of the growing nanowire. Therefore, recitation herein of growing the nanowire 'from the vertical surface'; growing the nanowire 'from adjacent the nanoparticle on the surface'; and growing the nanowire 'adjacent the nanoparticle', and the like used herein, all refer to the mechanism of initial growth and continued growth described hereinabove.

In some embodiments of the method 100 of growing, forming 120 the vertical surface optionally further comprises creating a surface irregularity on the vertical surface before activation 130. Nanoparticle catalysts tend favor positions on the vertical surface at surface irregularities when deposited. Therefore, in some embodiments, creating a surface irregularity provides for position control of nanoparticles. As such, creating a surface irregularity further provides for control of an initial or anchor position of the nanowire in these embodiments.

The surface irregularity can be formed in the relatively smooth vertical surface of the silicon by purposely misorienting a mask and etching to create an irregular surface geometry, such as a ledge in the surface. When an etch mask, such as the patterned oxide layer 112 of FIG. 2C, is essentially or perfectly aligned to the intersections of the vertical (111) planes with the top surface of the (110) Si substrate, etching a trench with vertical sidewalls produces relatively smooth surfaces with virtually no lateral etching of the trench sidewalls during forming 120. However, when the patterned oxide layer 112 is purposely misaligned relative to the intersections of the vertical (111) planes with the top surface, lateral etching of the sidewalls occurs while the trench is formed 120.

Figure 2H:
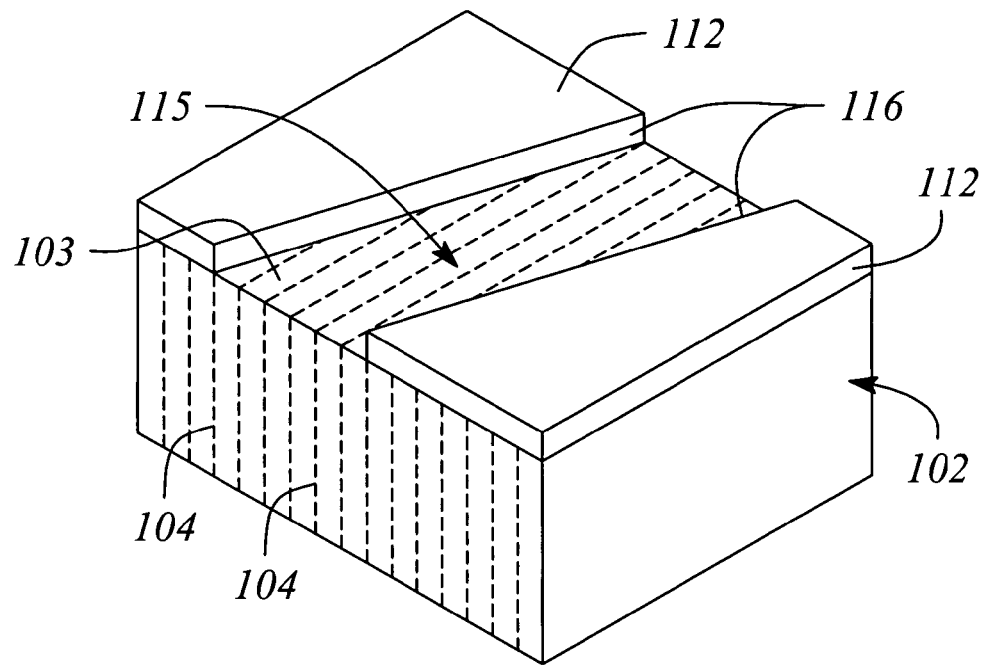
FIG. 2H illustrates a perspective view of the exemplary Si substrate with a patterned oxide layer misaligned with (111) planes of the substrate lattice according to an embodiment of the present invention.

FIG. 2H illustrates a perspective view of the exemplary substrate 102 with the patterned oxide layer 112 misaligned with (111) planes of the substrate lattice. The misalignment is an intentional slight angle relative to the intersection of the (111) planes 104 and the horizontal surface 103. As illustrated in FIG. 2H, the edges 116 of the patterned oxide layer 112 are intentionally misaligned from the dashed lines of the (111) planes 104.

Figure 2I:
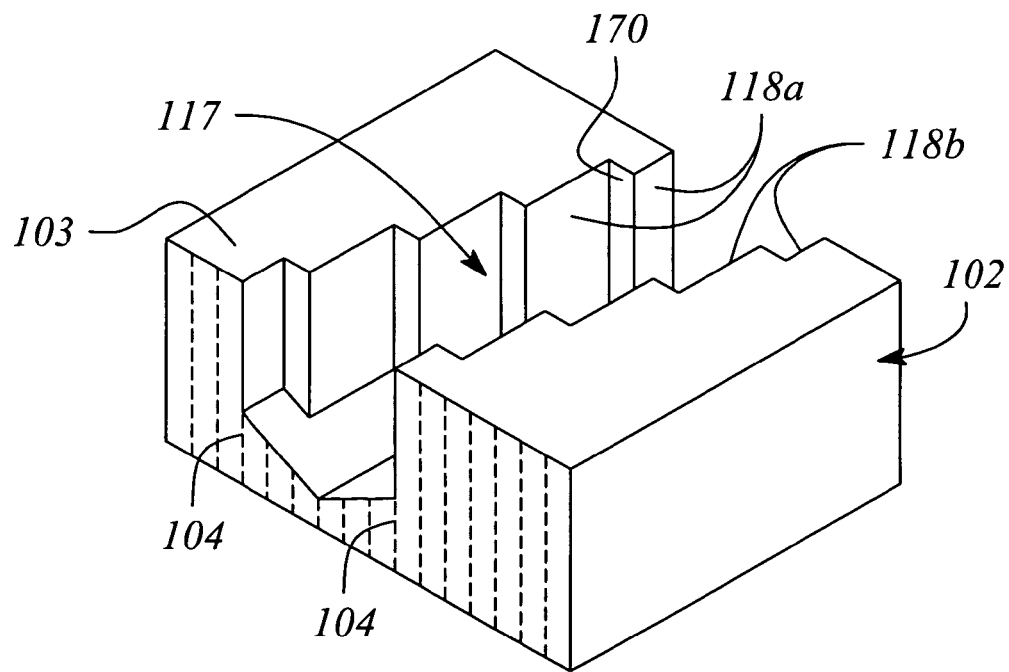
FIG. 2I illustrates a perspective view of the exemplary Si substrate of FIG. 2H after etching the substrate to form a trench with a surface irregularity according to an embodiment of the present invention.

FIG. 2I illustrates a perspective view of the exemplary Si substrate 102 of FIG. 2H after etching the substrate to form a trench 117 with a surface irregularity in the vertical sidewalls. When the oxide layer mask 112 is intentionally misaligned by a slight angle from the (111) plane 104 intersections, some lateral etching of the trench sidewalls 118a, 118b does occur, with the limited possible accumulation of the misalignment causing a surface irregularity 170 in a trench sidewall 118a, 118b.

The angle of misalignment measured from the intersections can range from about 0.1° to about 45° in some embodiments, and about 0.5° to about 20° in other embodiments, to deliberately create a surface irregularity 170 in the shape of a ledge 170 in the vertical sidewalls 118a, 118b. The ledge 170 is a lateral interruption or step in the relatively smooth surface of the trench sidewall 118a, 118b that extends approximately vertically along the sidewall 118a, 118b. Although illustrated in FIG. 2I as essentially straight, abrupt lateral steps in the sidewall surface, the ledge 170 may take any number of shapes and be within the scope of the invention. For example, rather than being straight and abrupt steps, the ledge may meander and have one or more kinks along its extent. In some embodiments, a plurality of ledges 170 may be intentionally created which laterally step approximately along different ones of vertical (111) planes in the crystal lattice structure of the trench sidewall 118a, 118b, depending on the angle of misalignment. Also depending on the embodiment, a correlation may exist between ledge size and/or ledge spacing/density and one or more of a frequency of nucleation, a density of nanowires, and an orientation of nanowires.

Therefore in another embodiment of the present invention, a method of controlling nanowire growth is provided. The method of controlling comprises forming a trench in a horizontal surface of a substrate using a misaligned etch mask. The formed trench has vertical sidewalls that are (111) planes of a semiconductor lattice. The (111) planes intersect with the horizontal surface of the substrate. The horizontal surface is a (110) plane of the semiconductor lattice.

The vertical sidewalls comprise a surface irregularity in an area of the sidewalls. The surface irregularity is formed by intentionally misaligning an etch mask at a slight angle from an intersection of the vertical (111) plane with the horizontal surface, and etching the substrate to create a ledge in the vertical surface. The surface irregularity is formed as the trench is formed, and the techniques for forming 120 of the method 100 may be used. However, rather than perfectly aligning the oxide layer 112 with the (111) planes 104 as in forming 120 of the method 100, the oxide layer 112 is intentionally misaligned, as described above, to form relatively smooth vertical sidewalls with a surface irregularity.

The method of controlling further comprises activating at least one of the sidewalls with a nanoparticle catalyst. The sidewall is activated by either depositing a catalyst material on a vertical sidewall and annealing the catalyst material to form a nanoparticle catalyst or depositing a nanoparticle catalyst directly on the vertical sidewall and optionally annealing. The sidewall is activated using the techniques described herein for activating 130 according to the method 100 of growing a nanowire.

The method of controlling still further comprises growing a semiconductor nanowire adjacent the nanoparticle catalyst. Growing may be accomplished using the techniques described herein for growing 140 of the method 100, or other techniques described herein. The nanowire growth in the area of the surface irregularity differs from nanowire growth in other areas of the sidewall. In some embodiments, a density of nanowire growth typically is less in the presence of the surface irregularities than when irregularities are not present in the sidewall. In other embodiments, the density of nanowire growth is inversely proportional to the density of surface irregularities. Therefore, a correlation exists between density of nanowires and a density of the irregularities or ledges. According to various embodiments of the method of controlling, a size and/or density of the surface irregularity correlates to one or more of frequency of nanowire nucleation, density of nanowire growth and orientation of nanowire growth.

Referring back to FIG. 1, in some embodiments, the method 100 of growing optionally further comprises impinging 150 a free end of the laterally growing nanowire on the second vertical surface. The optional nature of impinging 150 is illustrated with a dashed-line arrow in FIG. 1. Such an impinged, laterally grown nanowire attaches firmly to the second vertical surface and essentially bridges between (i.e., connects) the opposing vertical surfaces.

In some of these embodiments, the spacing of the opposing vertical surfaces may depend on a particular application, as mentioned above, and at least one or both of the materials chosen for the semiconductor nanowire that bridges the separation and the nucleating catalyst from which the semiconductor nanowire grows because these parameters affect the axial growth rate of the nanowires.

The impinged nanowire end in contact with the opposing vertical surface during growing 140 forms a self-assembled nanowire connection between the opposing vertical surfaces. Depending on the embodiment, self-assembled semiconductor nanowires make robust mechanical connections between the opposing vertical surface, and may further make robust electrical connections when impinged 150 between the opposing vertical surfaces.

Figure 3:
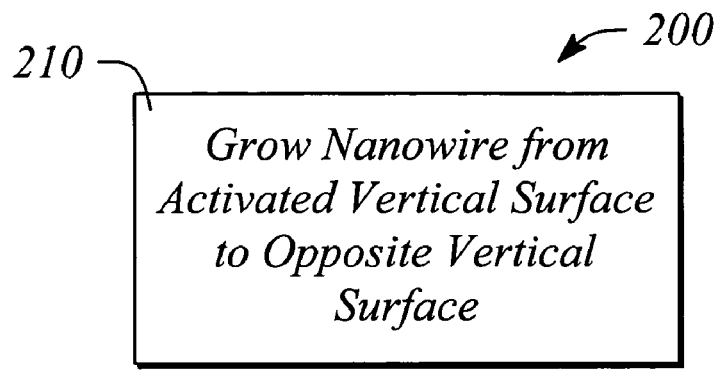
FIG. 3 illustrates a flow chart of an embodiment of a method of laterally bridging a nanowire between vertical surfaces of a substrate according to an embodiment of the present invention.

FIG. 3 illustrates a flow chart of an embodiment of a method 200 of laterally bridging a nanowire between vertical surfaces of a substrate. The material of the nanowire and the material of the substrate independently may be any of the semiconductor materials described above. The method 200 of laterally bridging comprises growing 210 a nanowire from an activated vertical surface to an opposite vertical surface of the substrate. The activated vertical surface is a vertical (111) plane of the substrate. Catalyst nanoparticles suitable for promoting nanowire growth are formed on the activated vertical surface. The opposing vertical surfaces of the substrate are spaced apart. The laterally bridged nanowire makes a mechanical connection between the opposing vertical surfaces. The bridged nanowire may further make an electrical connection between the opposing vertical surfaces, depending on the embodiment.

In some embodiments, the method 200 of laterally bridging further comprises activating the vertical surface with the nanoparticle catalyst before growing 210. In some of these embodiments, activating comprises depositing a catalyst material on the vertical surface, and annealing the deposited catalyst material to form the nanoparticle catalyst. In other embodiments, activating comprises depositing a nanoparticle catalyst directly on the vertical surface and optionally annealing. In some embodiments, the catalyst deposition may be accomplished by various deposition methods as described above for activating 130 the vertical surface of the method 100.

In some embodiments, the method 200 of laterally bridging further comprises forming the vertical surfaces of the substrate. In some embodiments, the vertical surfaces are formed using the various techniques described above for forming 120 vertical surfaces on or in a substrate of the method 100.

In some embodiments of the method 200 of laterally bridging, growing 210 the nanowire comprises exposing the activated vertical surface of the substrate to a precursor gas of a semiconductor material of the nanowire using a deposition technique, such as that described above for CVD and MOVPE and the like. In these embodiments, the semiconductor material grows 210 epitaxially in a columnar shape adjacent to the nanoparticle catalyst. The growth 210 continues until a free end of the growing nanowire impinges and attaches to the opposite vertical surface. In some embodiments, growing the nanowire may be accomplished by the techniques described above for growing 140 a nanowire and impinging 150 the growing nanowire of the method 100.

As mentioned above, while examples described herein typically recite a silicon nanowire and/or a silicon substrate, other semiconductor materials may be used and still be within the scope of the various embodiments of the present invention described herein both above and below. For example, it is within the scope of the embodiments herein to grow germanium Ge nanowires on a silicon substrate using gaseous germane $GeH_4$ in a CVD process. Moreover, it is within the scope of the embodiments herein to grow nanowires of any of the semiconductor materials mentioned above on a GaAs substrate, where the GaAs substrate material is etched to form vertical surfaces or trench sidewalls using RIE followed by a wet chemical etching to smooth the RIE-etched vertical surfaces, for example.

It is not intended for the different semiconductor materials described herein to be substituted for each other as equivalents or be generally interchangeable. Each semiconductor material described herein has unique characteristics and therefore imparts different properties when applied to the various embodiments of the present invention. References that provide materials and processes useful for processing other semiconductor materials in more detail include, but are not limited to, *Modern GaAs Processing Methods* by Ralph E. Williams, Artech House; (July 1990); *InP-Based Materials and Devices: Physics and Technology* by Osamu Wada (Editor), Hideki Hasegawa (Editor), Wiley-Interscience; (April 1999), pp. 295–309; and *InP and Related Compounds: Materials, Applications and Devices* (Optoelectronic Properties of Semiconductors and Superlattices), M. O. Manasreh (Editor); Taylor & Francis; (Aug. 1, 2000). These and other references, such as *High-Speed Semiconductor Devices*, Edited by S. M. Sze, A Wiley-Interscience Publication, John Wiley & Sons, Inc., 1990, cited supra, are readily available to those skilled in the art, such that other semiconductor materials may be used in the embodiments herein without undue experimentation.

In some embodiments of the method 200 of laterally bridging, each of the vertical surfaces may be a surface of an otherwise electrically isolated circuit element or electrode. The laterally bridging nanowire electrically connects the isolated electrodes to each other in these embodiments. Thus in these embodiments, the method 200 of laterally bridging further comprises defining an isolated device structure in the substrate before growing 210. The isolated device structure comprises electrically isolated electrodes with vertical surfaces that are activated with a nanoparticle catalyst before growing 210. In some embodiments, defining the device structure may be accomplished by the techniques described above for forming 120 parallel vertical surfaces on a substrate of the method 100, including using an SOI substrate, as described further below.

Each electrode comprises a different one of the opposite vertical surfaces. The laterally bridging nanowire makes an electrical connection between the electrodes. In some of these embodiments, the device structure allows the laterally bridging nanowire to be characterized. Moreover, in other of these embodiments, the device structure is an electronic device used for a variety of applications, including, but not being limited to, one or more of a chemical sensor, a gas sensor, a flow or fluid sensor, a biological sensor, a nanoelectronic device (such as a field-effect transistor) and a photonic device (such as a light emitting diode (LED) or a Laser). In some embodiments, the lateral nanowire need not bridge to an opposite electrode in a device application, such as a vibration sensor, for example.

Figure 4:
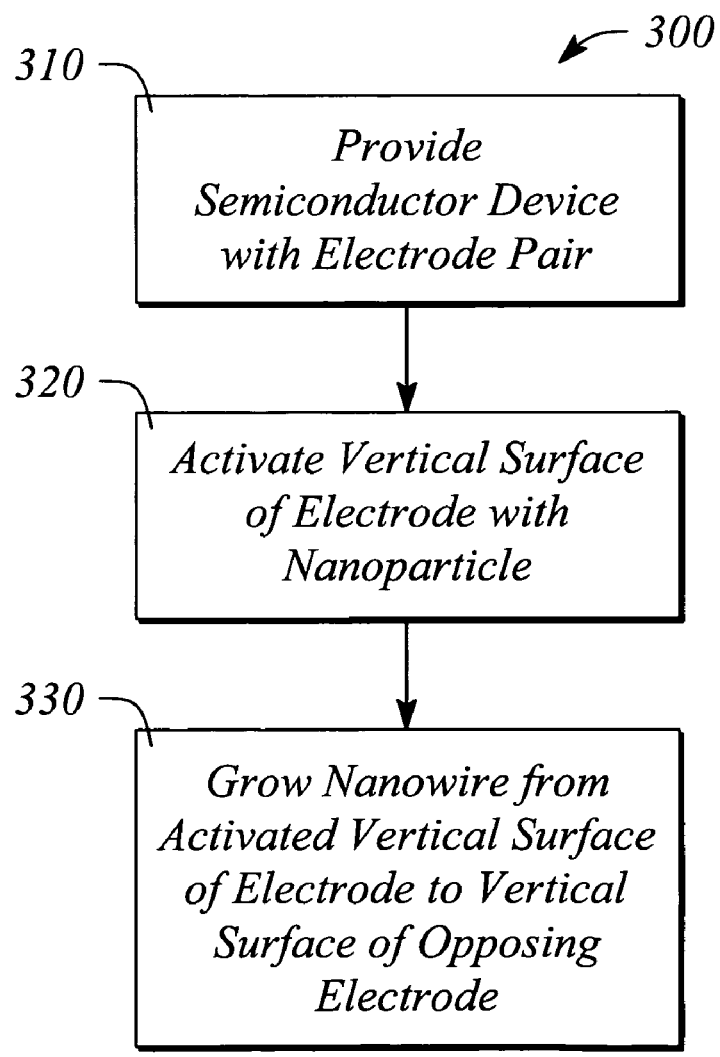
FIG. 4 illustrates a flow chart of an embodiment of a method of connecting electrodes of a semiconductor device with a semiconductor nanowire according to an embodiment of the present invention.

FIG. 4 illustrates a flow chart of an embodiment of a method 300 of connecting electrodes of a semiconductor device with a semiconductor nanowire according to an embodiment of the present invention. The method 300 of connecting comprises providing 310 a semiconductor device with a pair of semiconductor electrodes. Each electrode of the semiconductor device has a vertical surface that is a vertically oriented (111) plane of the semiconductor lattice of the semiconductor material, such as that used for the device. The vertical surface of one electrode opposes the vertical surface of the other electrode of the pair. The electrodes are spaced apart and are electrically isolated from one another before connecting according to the method 300. In some embodiments, providing 310 the semiconductor device may be accomplished by the techniques described above for forming 120 parallel vertical surfaces on or in a substrate of the method 100, including using an SOI substrate as described further below.

The method 300 of connecting further comprises activating 320 the vertical surface of an electrode of the pair with a nanoparticle catalyst. The nanoparticle catalyst on the activated vertical surface catalyzes growth of the semiconductor nanowire. In some embodiments, the vertical surface may be activated 320 using the technique of activating 130 a vertical surface with a nanoparticle catalyst, as described above for the method 100.

The method 300 of connecting further comprises growing 330 the semiconductor nanowire from the activated vertical electrode surface to the opposing vertical surface of the other electrode of the pair. The semiconductor nanowire grows 330 laterally adjacent to the nanoparticle catalyst, which is initially located on the activated electrode surface. The growing 330 nanowire has a columnar shape and a free end. The free end comprises the nanoparticle catalyst on its tip. The growing nanowire grows 330 at least until the free end impinges on the opposing vertical surface of the other electrode. The impinged end attaches to the opposing electrode vertical surface during growth 330. In some embodiments, growing 330 the semiconductor nanowire may be accomplished by the techniques described above for growing 210 the nanowire of the method 200. In other embodiments, growing 330 may be accomplished by the techniques of growing 140 and impinging 150 the nanowire of the method 100.

The impinged end makes a mechanical connection to the other electrode. Moreover, the laterally grown nanowire makes an electrical connection between the pair of electrodes. The laterally grown nanowire provides a self-assembly technique for interconnecting electrodes of the device.

During growing 330, the free end of the growing nanowire comprises an amount of the nanoparticle catalyst at its tip. In some embodiments, the nanoparticle catalyst is carried in a solid state on the tip of the free end of the growing nanowire. When the free end impinges on the opposing vertical surface of the other electrode, the nanoparticle catalyst at the impinged end attaches to the vertical wall surface, which in turn attaches the nanowire to the vertical wall surface. For these embodiments, a nanoparticle catalyst material is in a solid state at a temperature below a catalyst-semiconductor liquid eutectic temperature. For example, metal catalyst-semiconductor systems include, but are not limited to, a Si—Ti system where the lowest eutectic temperature is approximately 1350° C.; a Si—Pd system, where the lowest eutectic temperature is approximately 820° C.; and a Si—Pt system, where the lowest eutectic temperature is about 830° C. Moreover, non-metal catalysts include, but are not limited to, $SiO_x$, which remains a solid below a temperature of nanowire growth. Also as an example, a silicon nanowire grown using a silane gas as the Si source will grow at a temperature between approximately 600° C. and approximately 700° C.

In an example using Ti as the nanoparticle catalyst material and silicon as the semiconductor material of the nanowire, a Ti-nucleated silicon nanowire carries a Ti-silicide ($TiSi_2$) nanoparticle at its tip. The Ti-silicide nanoparticle remains in the solid state during the growth of the silicon nanowire. Upon impinging on the opposite surface, a rigid connection is formed between the nanowire and the surface.

In other embodiments, the nanoparticle catalyst is carried in a molten state on the tip of the free end of the growing nanowire. When the free end impinges on the opposing vertical surface of the other electrode, the nanoparticle catalyst at the impinged end attaches by spreading or diffusing radially along the opposing vertical surface from a point of impingement or contact. The diffused nanoparticle catalyst in turn attaches the nanowire to the opposing vertical surface. Nanoparticle catalyst materials that form radial-diffused disks upon impingement have a liquid eutectic temperature below the nanowire growth temperature so that the nanowires grow by a vapor-liquid-solid (VLS) growth mechanism. For example, some metal catalyst-semiconductor systems include, but are not limited to, a Si—Au system having a eutectic temperature of approximately 363° C., and a Si—Ga system having a eutectic temperature of approximately 30° C. Eutectic temperatures of other metal catalysts with a Si semiconductor or a Ge semiconductor, for example, are well known and are within the scope of this embodiment.

In an example using Au as the nanoparticle catalyst material and silicon as the semiconductor material of the nanowire, a Au-nucleated silicon nanowire carries a molten droplet of a Au—Si alloy at its tip. As the nanowire impinges on the opposing vertical surface, axial growth stops, and the molten alloy spreads radially along the vertical surface, contributing to catalytic decomposition of the deposition gas, for example silane $SiH_4$, and to further accelerated deposition of the silicon. The continued accelerated deposition forms the disk of material extending radially outward from a point of contact along the (111) plane of the vertical surface. The disk may be thicker near its edge. The thicker edge may indicate that lateral diffusion facilitates supplying $SiH_4$ to the disk, either along the vertical surface or in the gas phase. The radial-formed disk is rich in both the Si material of the semiconductor nanowire and the Au material of the catalyst. The size of the disk at the impinging end continues to increase with additional time after the nanowire bridges between the opposing vertical surfaces. Consequently, for a given deposition time, a diameter and a thickness of the disk are greater for narrower trenches because of longer time after the nanowire bridges. For a growth time of about 30 minutes in a CVD chamber, the disk diameter varies from approximately 600 nm to approximately 2 $\mu$m, and the disk thickness varies from approximately 10 nm to approximately 70 nm. However, the dimensions of the disk are dependent on at least the amount of time the nanowire is grown and the gas flow rate. In some of these embodiments, lateral growth of the nanowire ceases unless further nucleation occurs, as described further below. Moreover in some embodiments, the size of the disk (and even being able to observe the disk) depends on the diffusion of the nanoparticle material along the sidewall and is therefore greater when the nanoparticle is in the liquid phase than when it is in the solid phase.

In some embodiments, the method 300 of connecting provides the bridged nanowire with a mechanically robust connection to the opposing vertical surfaces of the electrode pair. Further, the bridged nanowire may be mechanically strong. For example, the nanowire may have adequate mechanical rigidity to grow 330 without elastic deformation. Moreover, the nanowire may not be deflected by a flow of gas or fluid during growth 330, and may not be deflected when impinged on the opposing vertical surface. As another example, during subsequent use of the nanowire, the nanowire may not deform when exposed to the environment, such as when exposed to the flow of gas or fluid. In some embodiments, after impingement of a primary nanowire, the catalyst transported to the second sidewall allows secondary nucleation and nanowire growth from the second sidewall toward the original first sidewall. Similarly, tertiary nucleation and nanowire growth can occur from the first sidewall after a secondary nanowire impinges on this sidewall.

Figure 5:
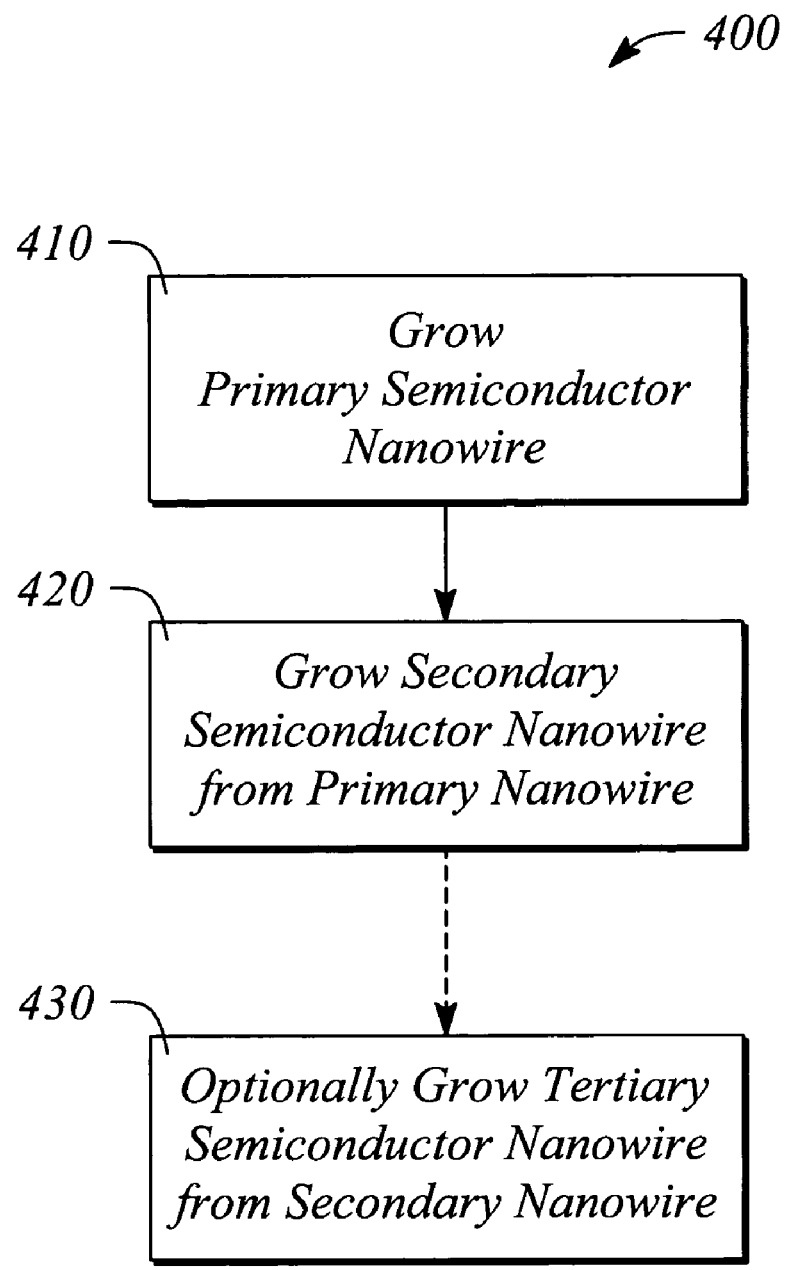
FIG. 5 illustrates a flow chart of an embodiment of a method of bridging semiconductor nanowires between a pair of spaced apart semiconductor electrodes of a device according to an embodiment of the present invention.

FIG. 5 illustrates a flow chart of an embodiment of a method 400 of bridging semiconductor nanowires between a pair of spaced apart semiconductor electrodes of a device according to an embodiment of the present invention. The semiconductor nanowires bridge the electrode pair from opposite lateral directions. The electrode pair comprises a semiconductor material. In some embodiments, the method 400 of bridging comprises growing semiconductor nanowires between opposing vertical surfaces of the spaced apart electrode pair. The opposing vertical surfaces are activated with a nanoparticle catalyst and are (111) semiconductor lattice planes. The semiconductor nanowires grow in opposing lateral directions to bridge between the vertical surfaces of the electrode pair. In some of these embodiments, the nanowires grow simultaneously from the opposing vertical surfaces to connect the electrode pair.

In some embodiments, the method 400 of bridging comprises growing 410 a primary semiconductor nanowire from a first vertical surface of a first electrode of the pair of electrodes to an opposite, second vertical surface of a second electrode of the pair. The first vertical surface comprises a vertically oriented (111) lattice plane of the semiconductor and a nanoparticle catalyst. Growing 410 comprises impinging or contacting a free end of the primary semiconductor nanowire on the second vertical surface of the second electrode at a primary impingement point. The free end of the primary nanowire comprises an amount of nanoparticle catalyst at its tip.

Since the tip of the primary nanowire contains an amount of the nanoparticle catalyst, additional nucleation of nanowires can occur during extended deposition or growth after the primary nanowire impinges on the second vertical surface. The method 400 of bridging semiconductor nanowires further comprises growing 420 a secondary semiconductor nanowire adjacent to the primary impingement point. The second vertical surface comprises a vertically oriented (111) plane also. The secondary nanowire grows 420 laterally from near the primary point of impingement toward the first vertical surface of the first electrode. The secondary nanowire comprises a free end that, during growing 420, impinges on the first vertical surface of the first electrode at a secondary impingement point. The lateral direction of secondary growth 420 is in an opposite direction to that of the lateral direction of primary growth 410. The free end of the secondary nanowire comprises an amount of the nanoparticle catalyst.

The method 400 of bridging semiconductor nanowires optionally further comprises growing 430 a tertiary semiconductor nanowire from the first vertical surface of the first electrode in a vicinity of or adjacent to the secondary impingement point of the secondary nanowire. The optional nature of growing 430 is illustrated as a dashed-line arrow in FIG. 5. The tertiary nanowire grows 430 laterally to impinge on the second electrode vertical surface in a similar fashion to the growth 410 of the primary nanowire, described above. Depending on the embodiment, the method 400 of bridging may further comprise additional nanowire growth from the impingement of the tertiary nanowire. Any subsequently grown nanowire from the tertiary nanowire can be grown in a manner similar to that described above for the primary nanowire growth 410 and the secondary nanowire growth 420.

In some embodiments, growing 410 may be accomplished by the technique described above for growing 330 of the method 300. The semiconductor nanowire may comprise any of the above-described semiconductor materials. In some embodiments, the nanowire comprises silicon or GaAs. The catalyst material may comprise any of the above-mentioned metals and nonmetals. In some of these embodiments, the nanoparticle catalyst comprises titanium. In others of these embodiments, the nanoparticle catalyst comprises gold. The semiconductor device may comprise any of the above-described semiconductor materials. In some embodiments, the semiconductor device comprises a silicon device, such that the vertical surfaces of the electrodes comprise (111) Si surfaces. In other embodiments, the semiconductor device is fabricated on an SOI wafer, as described further below.

Figure 6:
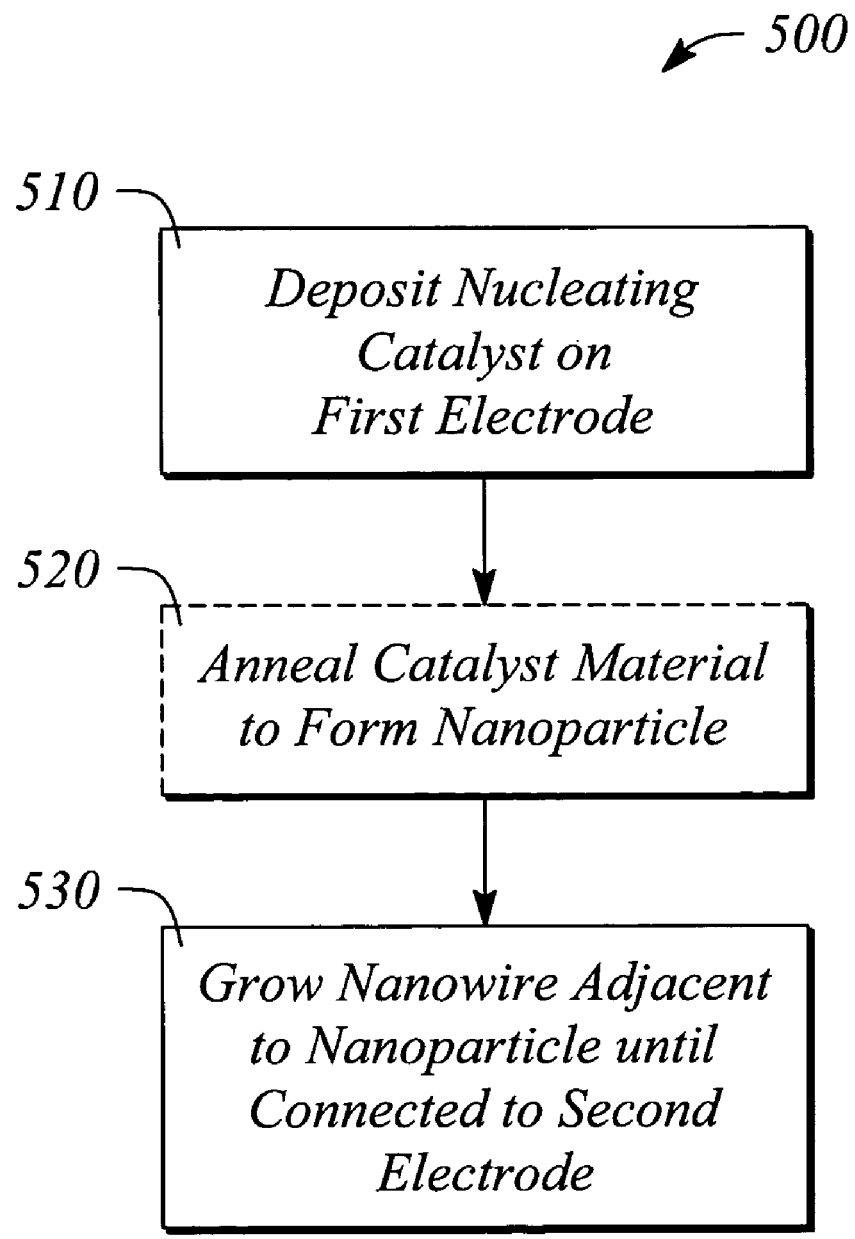
FIG. 6 illustrates a flow chart of an embodiment of the method of self-assembling a nanowire between an electrically isolated semiconductor electrode pair of an electronic device according to an embodiment of the present invention.

FIG. 6 illustrates a flow chart of an embodiment of a method 500 of self-assembling a nanowire between an electrically isolated semiconductor electrode pair of an electronic device according to an embodiment of the present invention. The method 500 of self-assembling comprises depositing 510 a nucleating catalyst on a vertical surface of a first electrode of the pair. The vertical surface is a (111) lattice plane of a semiconductor material used for the electrodes. The electrode pair has opposing, spaced apart vertical (111) surfaces. The nucleating catalyst is optionally either a nanoparticle that is deposited directly to the vertical surface or a catalyst material. In embodiments that optionally employ the catalyst material as the nucleating catalyst, the method 500 of self-assembling further comprises annealing 520 the catalyst material to form the nanoparticle on the vertical surface of the first electrode. The dashed-line box around annealing 520 in FIG. 6 indicates that annealing is performed when the catalyst material is employed and that annealing is optional when the nanoparticle catalyst is employed.

The method 500 of self-assembling further comprises growing 530 a nanowire adjacent the nanoparticle. The nanowire grows 530 laterally from the vertical surface of the first electrode. The growing nanowire comprises a free end having an amount of the nanoparticle material at its tip. Growing 530 comprises contacting the free end of the growing nanowire to the vertical surface of a second electrode of the pair, such that the laterally grown nanowire self-assembles to bridge and connect between the electrode pair. The nanoparticle at the tip of the contacted nanowire facilitates connection of the nanowire to the vertical surface of the second electrode, such that a mechanically robust, self-assembled connection is achieved. In some embodiments, the self-assembled nanowire provides an electrical connection between otherwise electrically isolated electrodes of the pair.

In some embodiments, the method 500 of self-assembling further comprises growing a secondary nanowire from adjacent to a point of impingement of a contacted end of the first-mentioned or primary nanowire. The secondary nanowire grows laterally from the vertical surface of the second electrode toward the vertical surface of the first electrode. In some embodiments, growing a secondary nanowire is similar to or may be accomplished by the technique described above for growing 420 a secondary nanowire of the method 400.

Moreover in some embodiments, the method 500 of self-assembling may further comprise growing a tertiary nanowire that is similar to or may be accomplished by the technique described above for optionally growing 430 a tertiary nanowire of the method 400. It is within the scope of the embodiments of the method 500 of self-assembling to grow further nanowires from the tertiary growth similar to that described for the method 400.

The nanowires grown 530 according to the method 500 are semiconductor nanowires comprising any of the semiconductor materials described above. The electronic device is a semiconductor device comprising any of the above-described semiconductor materials. Moreover, the nanoparticle catalyst comprises any of the metal or nonmetal catalyst materials described above.

Figure 7A:
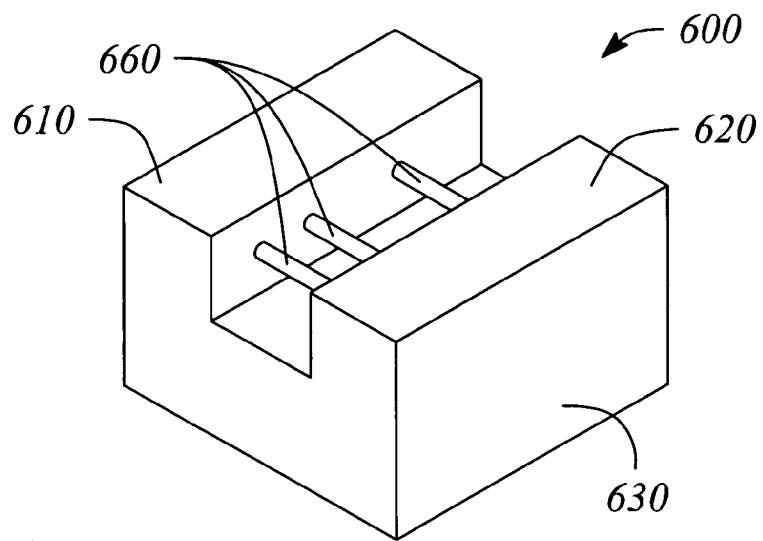
FIG. 7A illustrates a perspective view of an embodiment of an electronic device having a nano-scale interconnection according to an embodiment of the present invention.
Figure 7B:
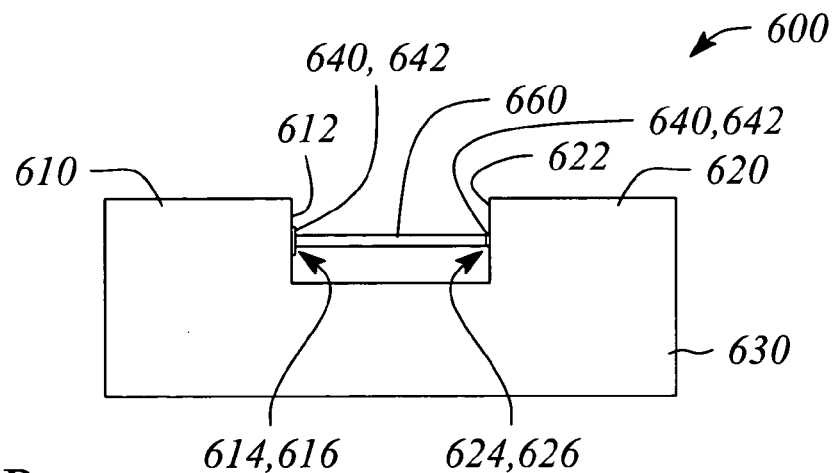
FIG. 7B illustrates a side view of the embodiment of the electronic device of FIG. 7A according to an embodiment of the present invention.

In yet another embodiment of the present invention, an electronic device 600 having a nano-scale interconnection is provided. FIG. 7A illustrates a perspective view of an embodiment of the electronic device 600. FIG. 7B illustrates a side view of the embodiment illustrated in FIG. 7A. The electronic device 600 comprises a pair of spaced apart semiconductor electrodes 610, 620 supported by a substrate 630. The electrodes 610, 620 each have a vertical surface 612, 622 comprising a vertically oriented (111) plane of a semiconductor lattice. A first vertical surface 612 of a first electrode 610 of the pair opposes a second vertical surface 622 of a second electrode 620 of the pair. Moreover, at least one of the electrodes 610, 620 comprises a nanoparticle catalyst 640, 642 on a respective vertical surface 612, 622 thereof to nucleate nanowire growth.

The electronic device 600 further comprises at least one semiconductor nanowire 660 that laterally bridges between the pair of electrodes 610, 620. The nanowire 660 bridges from the first vertical surface 612 to the second vertical surface 622. The nanowire 660 extends from an initial location 614, 624 of the nucleating nanoparticle catalyst 640, 642 on the first surface 612, 622 to a point of contact 616, 626 on the opposing vertical surface 612, 622. The point of contact 616, 626 comprises some nanoparticles 640, 642 transported by the nanowire 660 during self-assembly between the electrode pair 610, 620.

In some embodiments, the substrate 630 is a semiconductor material, which optionally is similar to the semiconductor material of the electrodes 610, 620, depending on the embodiment. In other embodiments, the substrate is an insulator material upon which the electrode 610, 620 structures are formed. In still other embodiments, the substrate comprises a semiconductor layer or portion from which the electrodes are formed, a support layer or portion, and an insulator layer between the semiconductor layer and the support layer. In embodiments that include an insulator layer, the substrate is a semiconductor-on-insulator substrate (SOI).

Figure 7C:
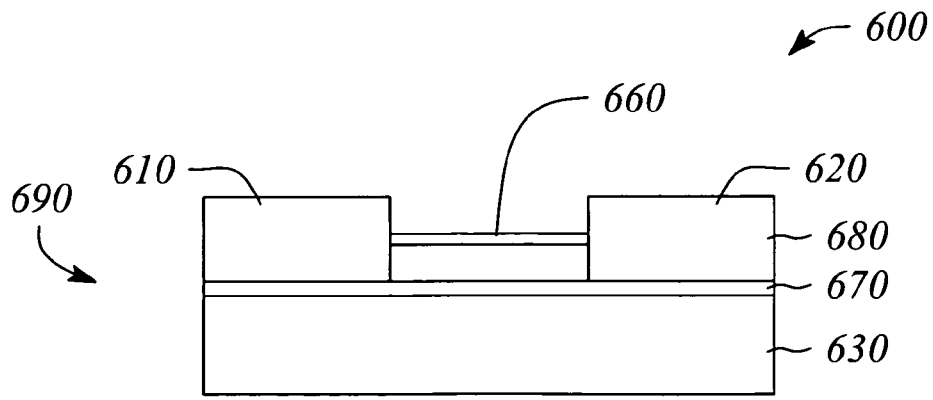
FIG. 7C illustrates a side view of another embodiment of an electronic device having a nano-scale interconnection according to an embodiment of the present invention.

FIG. 7C illustrates a side view of an embodiment of the electronic device 600 comprising a semiconductor-on-insulator substrate 690. In this embodiment, the semiconductor-on-insulator substrate 690 comprises a semiconductor layer 680, a support layer 630 and an insulator layer 670 disposed between layers 680 and 630. The insulator layer 670 facilitates electrically isolating the electrodes 610, 620 from one another, and physically and electrically isolates the electrodes 610, 620 from the support layer 630. More generally, the insulator layer 670 separates the semiconductor layer 680 and a support layer 630. For example, an electronic device 600 may be fabricated from a silicon-on-insulator substrate or wafer, depending on the embodiment. Typically, the insulator layer 670 includes, but is not limited to, any one or more of silicon dioxide ($SiO_2$), silicon nitride ($Si_3N_4$), and aluminum oxide ($Al_2O_3$). Moreover, the support layer 630 includes, but is not limited to, any one or more of a semiconductor material, a conductor material and an insulator material that provides strength or support to the substrate or wafer 690.

In some embodiments that use silicon for the semiconductor layer 680, the device 600 is fabricated from an (110) oriented silicon layer 680. For example, the electrode pair 610, 620 is formed from or in the silicon layer 680 with a vertical profile, as described above for any of the methods 100, 200, 300, 400 and 500. The silicon layer 680 is adjacent to the insulator layer 670. The insulator layer 670 is adjacent to the substrate support layer 630. The electrodes 610, 620 are doped with an appropriate dopant to increase electrical conductivity of the electrodes 610, 620. The insulator layer 670 masks the underlying substrate support layer 630 from the dopant.

In some embodiments, an array of devices 600 may be fabricated in the semiconductor layer 680 of the SOI wafer 690. The insulator layer 670 facilitates isolating each electrode of the array from the other electrodes and isolates the electrodes from the support layer 630. To further isolate the devices from each other, intersecting trenches or other isolation regions would be included. The insulator layer 670 also masks the underlying substrate support layer 630 from the etching and doping processes. Moreover, one or more stacked insulator layers 670 may provide for the manufacture of a multilayer device 600 or multilayer arrays of devices 600 having laterally bridging semiconductor nanowire interconnections.

The SOI substrate 690 may be constructed as a sandwich of layers beginning with a substrate 630, for example a silicon substrate. The insulator layer 670 is applied to, deposited on or grown on a top or substrate surface of the substrate 630. For example, a thermal oxide layer (e.g., $SiO_2$) 670 may be grown on the substrate 630 surface, or a $Si_3N_4$ layer 670 may be deposited on the substrate 630 surface, depending on the embodiment. A first surface of the insulator layer 670 is adjacent to the substrate 630 surface. Then, a semiconductor layer 680 is formed on a top or second surface of the insulator layer 670. The second surface of the insulator layer 670 is on a side that is opposite to the substrate 630. For example, a Si layer 680 may be formed thereon by bonding a Si substrate to the second surface of the insulator layer 670. Then a majority of one of the substrates 680, 630 can be removed. The resulting structure 690 comprises an insulator layer 670, a thin semiconductor layer 680 on a side of the insulating layer 670, and a relatively thicker substrate 630 on another side of the insulator layer 670. The thicker substrate layer 630 provides mechanical support and possible electrical functions. This technique of forming an SOI structure 690 is called "bond and etch back" SOI (BESOI).

In another example, a high dose of oxygen is implanted beneath a surface of a semiconductor substrate or wafer, such as a Si wafer. During subsequent annealing at a high temperature, the oxygen reacts with the semiconductor to form an insulator layer 670 within the wafer. For example, for a silicon wafer, an $SiO_2$ insulator layer 670 may be formed. The implantation provides a surface layer 680 separated from a substrate support layer 630 with the insulator layer 670. The insulator layer 670 provides electrical isolation between the surface layer 680 and the substrate 630. This technique of forming an SOI structure 690 is called "separation by implantation of oxygen" (SIMOX).

In other examples, the SOI substrate comprises an essentially insulating substrate material upon which is deposited, grown, or laminated a semiconductor material such as, but not limited to, a Si material. This SOI substrate would include an insulator layer that is relatively thicker than the insulator layer 670 illustrated in FIG. 7C and exclude the support layer 630. The thicker insulator layer would provide any desired support. An electronic device embodiment that comprises this example of an SOI substrate is not illustrated herein. However, this device embodiment may be visualized from the device embodiment 600 in FIG. 7C. For example, the insulator layer 670 would be thicker to encompass all or a portion of the thickness of the illustrated support layer 630, but exclude the actual support layer 630. Some of these SOI substrates 690 comprise a diamond or sapphire insulator substrate 670 with either an epitaxial or a single crystal layer 680 of a semiconductor material applied to a top surface thereof, for example. Where the semiconductor material is silicon, the Si layer 680 is (110) oriented.

An SOI substrate 690 can be used instead of a single layer substrate 630 in the various embodiments of the present invention described herein to provide features that a single layer substrate alone does not provide. For example, a first Si layer 680 of an SOI wafer 690, which is (110) oriented, can be etched to produce the (111) vertical surfaces, as described above with respect to forming 120 of the method 100. In the sandwich SOI wafer 690 configurations, the insulator layer 670 protects the second or underlying substrate layer 630 from the etching processes performed on the silicon layer 680 to form the electrodes 610, 620.

In some embodiments, the electronic device 600 may be fabricated using only optical lithography. For example, a large array of nano-scale sensors can be fabricated between biasing electrodes. The nanowire structure combines an essentially 'bottom-up' fabrication (i.e., self-assembly) of nanostructures with an essentially 'top-down' formation (i.e., lithography) of the connecting electrodes using only coarse optical lithography. As an approach to the fabrication of nano-scale electronic devices, in some embodiments, costly and slow electron-beam lithography may be avoided, and massively parallel, self-assembled devices may be provided. Some method embodiments and device embodiments described herein provide self-assembled nano-bridges that may offer high surface area-to-volume ratio useful for nano-sensor applications, as well as other nano-electronic and photonic applications.

EXAMPLES

In a particular example of laterally growing nanowires as described hereinabove in various embodiments, the oxide layer is a thermal oxide that is patterned using photoresist and optical lithography to define locations of several trenches in a top surface of an (110) oriented Si substrate. Opposing sidewalls of the trenches, so defined and located, coincide with opposing pairs of (111) planes in the Si substrate.

The patterned thermal oxide layer of the substrate is then etched using reactive ion etching (RIE). For the example, RIE uses a combination of a trifluoromethane ($CHF_3$) gas and an Argon (Ar) gas. RIE exposes portions of the silicon surface of the substrates. The exposed portions are where the trenches are to be formed. As such, the patterned etched thermal oxide layer forms an oxide mask for use in subsequent silicon etching.

Following RIE and removal of the resist layer, the substrates are etched using a liquid-phase etching solution. The etching solution comprises about 45 weight percent (wt. %) potassium hydroxide with the balance being water (KOH—$H_2O$); The silicon exposed by the oxide mask is anisotropically etched with the etching solution for about 1 minute at a temperature of about 110° C. The etching creates trenches in the silicon substrates at locations defined by the oxide mask. The resulting trenches formed by etching are approximately 8 μm deep and approximately 2 μm to approximately 15 μm wide, with the trench widths determined by the dimensions on the lithographic mask.

Following silicon etching, a nucleation layer for nanowire growth is deposited on sidewalls of the trenches. The catalyst material for nucleation is deposited by electron-beam evaporation using angled deposition onto a vertical silicon surface of each trench formed by etching. A deposition angle of approximately 45° is used. The catalyst material is a metal catalyst. Some substrates are activated using a titanium (Ti) metal catalyst and other substrates are activated with a gold (Au) metal catalyst. In both cases, the metal catalyst is deposited to a thickness of approximately 1 nm.

Due to the geometry of the trenches and the deposition angle of 45°, essentially no catalyst is deposited on the bottoms of trenches. However, in other instances catalyst may be deposited on the bottoms of trenches especially when the trenches are wider than about 8 μm or a deposition angle of greater than about 45° (measured from the substrate surface plane) is used. Also, catalyst may be deposited on portions of the oxide etch mask (i.e., on the horizontal surface between adjacent trenches) during deposition.

Continuing with the example, the substrates are then transferred through air to a lamp-heated chemical vapor deposition (CVD) reactor. In the CVD reactor, the substrates are supported by a silicon carbide (SiC)-coated graphite plate of moderate thermal mass. The substrates that are activated with Ti are annealed in hydrogen at approximately 625° C. to reduce native oxide on the Ti metal catalyst and to form titanium silicide ($TiSi_2$) nanoparticles. The substrates activated with Au are annealed in the hydrogen at approximately 625° C. to form gold-silicon (Au—Si) alloy nanoparticles.

The temperature of the substrates is then increased to approximately 635° C., and a mixture of silane ($SiH_4$) and hydrogen chloride (HCl) is introduced into the hydrogen ($H_2$) carrier gas to grow silicon nanowires for both catalyst types. A total pressure is controlled at approximately 10 Torr, with about 3 standard liters per minute (slm) of hydrogen gas, about 15 standard cubic centimeters per minute (sccm) of $SiH_4$ gas and about 15 sccm of HCl gas.

Exemplary Au-nucleated laterally grown nanowires have a diameter of approximately 180 nm±approximately 20 nm. For separations or gaps in trenches that are approximately 8 μm wide or less, many Au-nucleated nanowires extend completely across the trench. Most Au-nucleated nanowires are straight and approximately 70% of them intersected the opposing vertical surface at an angle of 90°±about 0.50. Exemplary Ti-nucleated laterally grown silicon nanowires have a diameter of approximately 200 nm near a nucleating end or base and approximately 150 nm near an impinging end.

No separate post-growth processing of the exemplary laterally growing nanowires to initiate a connection to the opposing sidewall is performed in the particular example described above. Specifically, connection to an opposing wall of a trench is accomplished by growing the nanowires until the nanowires impinge on the opposing sidewall of the trench.

Some embodiments of the present invention provide for characterizing the laterally grown nanowires, while others provide for fabrication of devices, both without separate post-growth attachment of the nanowires to the vertical surfaces (electrodes). The nanowire position, length and diameter can be controlled by some embodiments of the present invention. Moreover, some embodiments herein can be used for commercial manufacturing of devices with nanowires.

Intentionally misaligning a mask that defines the vertical sidewalls of a trench and etching the sidewalls with the misaligned mask control nanoparticle position and subsequent nanowire growth. Etching with a misaligned mask causes lateral ledge formation on the (111) vertical surface that extends a distance ranging from the bottom of the sidewall to the top of the sidewall. The formed ledges contain many steps and kinks. However, the general shape of the ledge tends to be similar near the top of the trench.

An approximate 6° misaligned mask produces a trench with sidewalls having a number of ledges with irregularly distributed kinks. A metal catalyst material, such as Ti or Au, deposited after ledge formation favors positions on the ledges. Without being limited to a reason for the preferential positioning of the catalyst material, it is believed that the purposefully formed surface irregularity or ledge provides a low-energy site for preferential positioning of the catalyst material on the surface probably due to a higher density of broken bonds in the ledge regions. Moreover, the orientation of most of the nanowires grown from ledge locations is in the (111) direction, the same as that for nanowires originating from non-ledge locations.

However, the average density of nanowires on a surface with ledges is observed to be lower than the average density on a surface where ledges are not intentionally formed.

Although the same amount of Ti catalyst is deposited on the sidewalls compared to trenches formed without intentionally misaligning the mask, the number of nanowires is diminished to a few nanowires per unit area in the area of the ledges. Therefore, a correlation exists between ledge size and/or ledge density and the frequency of nucleation by the metal catalyst. Moreover, correlation exists between ledge size and a density of grown nanowires.

Thus, there have been described methods of lateral nanowire growth, lateral nanowire bridging, and control of nanowire growth. Moreover, methods of connecting electrodes of electronic devices and self-assembly with laterally grown nanowires have been described. In addition, a device that employs a lateral nanowire interconnection has been described. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A method of growing a nanowire in a lateral direction comprising:
    forming vertical surfaces on or in a horizontal surface of a silicon substrate, the vertical surfaces being vertical relative to the horizontal surface, the vertical surfaces being (111) silicon lattice planes;
    activating a first vertical surface of the vertical surfaces with a nanoparticle catalyst; and
    growing a semiconductor nanowire laterally from the activated first vertical surface in a direction toward a second surface of the vertical surfaces, the second vertical surface being spaced from and opposite to the first vertical surface.

2. The method of growing of claim 1, wherein activating comprises using preferential deposition to selectively deposit a catalyst material on the first vertical surface to an approximate exclusion of the second vertical surface.

3. The method of growing of claim 2, wherein using preferential deposition comprises depositing the catalyst material at an angle less than 90° measured from the horizontal surface of the substrate.

4. The method of growing of claim 1, wherein forming comprises aligning an etch mask on the horizontal surface along at least two of the vertical (111) planes in the silicon that intersect with the horizontal surface; and etching the silicon substrate to form the first and second vertical surfaces along the two (111) planes, and
    wherein growing comprises exposing the activated vertical surface to a gas comprising a semiconductor material of the nanowire, the nanowire growing laterally adjacent the nanoparticle catalyst.

5. The method of growing of claim 1, wherein forming comprises intentionally misaligning an etch mask at an angle from an intersection of at least two (111) planes with the horizontal surface, the angle ranging from about 0.1° to about 45°; and etching the silicon substrate to form the vertical surfaces, wherein etching with the misaligned mask creates a surface irregularity in the vertical surfaces.

6. The method of growing of claim 5, wherein the surface inegularity comprises a ledge that laterally steps along a different (111) plane in the crystal lattice.

7. The method of growing of claim 1, wherein forming comprises creating a surface irregularity in the first vertical surface to control nanowire growth.

8. The method of growing of claim 7, wherein the surface inegularity is a ledge extending a distance along the vertical surface, the ledge forming a lateral step in the vertical surface.

9. The method of growing of claim 7, wherein one or more of a size of and a density of the ledge correlates to one or more of frequency of nanowire nucleation, density of nanowire growth and orientation of nanowire growth.

10. The method of growing of claim 1, wherein the silicon substrate is a silicon-on-insulator substrate comprising a silicon layer on an insulator layer, the vertical surfaces being formed in the silicon layer.

11. The method of growing of claim 1, wherein forming comprises:
    etching the substrate to form the vertical surfaces, the etched substrate comprising the vertical surfaces and the relatively horizontal surface;
    depositing a mask material on all surfaces of the substrate;
    selectively removing the mask material from the horizontal surface of the substrate to expose the horizontal surface;
    passivating the exposed horizontal surface; and
    removing the mask material from the vertical surface to expose the vertical surface before activating the vertical surface.

12. The method of growing of claim 1, wherein the nanowire is grown using a semiconductor material selected from an element from group IV, two different elements from group IV, an element from group III with an element from group V, and an element from group II with an element from group VI.

13. The method of growing of claim 1, wherein the nanowire is grown using a semiconductor material selected from silicon (Si), germanium (Ge), silicon carbide (SiC), gallium arsenide (GaAs), gallium nitride (GaN), gallium phosphide (GaP), indium phosphide (InP), indium arsenide (InAs), aluminum nitride (AlN), zinc oxide (ZnO), and cadmium sulfide (CdS).

14. The method of growing of claim 1, wherein growing comprises growing a silicon nanowire on the silicon substrate, the method further comprising exposing the activated vertical surface to a silicon-containing gas in a deposition system to laterally grow the silicon nanowire adjacent the nanoparticle catalyst.

15. The method of growing of claim 1, wherein growing comprises growing a germanium nanowire on the silicon substrate, the method further comprising exposing the activated vertical surface to a germanium-containing gas in a deposition system to laterally grow the germanium nanowire adjacent the nanoparticle catalyst.

16. The method of growing of claim 1, wherein growing comprises growing a gallium arsenide nanowire on the silicon substrate, the method further comprising exposing the activated vertical surface to a gas mixture of a gallium-containing gas and an arsenide-containing gas in a deposition system to laterally grow the gallium arsenide nanowire adjacent the nanoparticle catalyst.

17. The method of growing of claim 1, further comprising:
    impinging a free end of the laterally growing nanowire on the second vertical surface to connect the nanowire from the first vertical surface to the second vertical surface, the free end comprising an amount of the nanoparticle catalyst from the first vertical surface.

18. The method of growing of claim 17, further comprising:

growing a secondary nanowire from the second vertical surface adjacent a point of impingement of the free end of the laterally grown nanowire, the point of impingement comprising the nanoparticle catalyst from the free end, wherein growing the secondary nanowire comprises growing laterally and impinging on the first vertical surface a free end of the secondary nanowire with an amount of the nanoparticle catalyst.

19. The method of growing of claim 18, further comprising:

growing a tertiary nanowire from the first vertical surface adjacent a point of impingement of the secondary nanowire, the point of impingement comprising the nanoparticle catalyst from the free end of the second vertical surface, wherein growing the tertiary nanowire comprises growing laterally and impinging on the second vertical surface a free end of the tertiary nanowire with an amount of the nanoparticle catalyst.

20. A method of growing a nanowire in a lateral direction comprising:

forming vertical surfaces on or in a semiconductor layer of a semiconductor-on-insulator substrate, the semiconductor layer has a (110) horizontal surface relative to the vertical surfaces, the vertical surfaces being vertical (111) lattice planes of the semiconductor layer;

activating a first surface of the vertical surfaces with a nanoparticle catalyst; and growing a semiconductor nanowire laterally to connect from the activated vertical surface to a second surface of the vertical surfaces.

21. The method of growing of claim 20, wherein a semiconductor material of the nanowire and a semiconductor material of the semiconductor layer are either the same or different.

22. The method of growing of claim 20, wherein the first vertical surface comprises a surface irregularity, the surface inegularity controlling a position of the nanoparticle catalyst on the first vertical surface before growing the semiconductor nanowire.

23. A method of laterally bridging a nanowire between vertical surfaces of a silicon substrate comprising:

growing a semiconductor nanowire from an activated vertical surface to an opposite vertical surface of a horizontally oriented (110) silicon substrate, the substrate is horizontally oriented relative to the vertical surfaces, the vertical surfaces being spaced apart, the activated surface being a vertical (111) silicon lattice plane and comprising a nanoparticle catalyst, wherein the laterally bridged nanowire is mechanically connected between the vertical surfaces.

24. The method of laterally bridging of claim 23, wherein growing a semiconductor nanowire comprises:

depositing a semiconductor material on the activated surface, the material growing laterally adjacent the nanoparticle catalyst; and impinging a free end of the laterally growing nanowire on the opposite vertical surface.

25. The method of laterally bridging of claim 23, wherein the nanoparticle catalyst is either a metal catalyst selected from titanium, gold, platinum, palladium, nickel, iron, cobalt and gallium or a nonmetal catalyst selected from $SiO_x$, where x ranges from about 1 to less than 2.

26. A method of connecting electrodes of a semiconductor device with a semiconductor nanowire comprising:

activating a semiconductor electrode with a nanoparticle catalyst, the activated electrode having a vertical surface that is a (111) semiconductor lattice plane, the vertical surface comprising the nanoparticle catalyst; and growing a semiconductor nanowire from the vertical surface laterally to an opposing electrode of the semiconductor device, the opposing semiconductor electrode being spaced from the activated electrode and having a vertical surface that opposes the activated electrode vertical surface, a free end of the growing nanowire mechanically connecting to the opposing vertical surface.

27. The method of connecting of claim 26, wherein the laterally grown semiconductor nanowire further electrically connects the electrodes of the semiconductor device.

28. The method of connecting of claim 26, wherein activating a semiconductor electrode with a nanoparticle catalyst comprises depositing a catalyst material on the vertical surface, and annealing the catalyst material to form the nanoparticle catalyst.

29. The method of connecting of claim 26, wherein activating a semiconductor electrode with a nanoparticle catalyst comprises depositing the nanoparticle catalyst directly on the vertical surface.

30. The method of connecting of claim 26, wherein the semiconductor device electrodes and the semiconductor nanowire both comprise silicon.

31. The method of connecting of claim 26, wherein a semiconductor material of the electrodes and a semiconductor material of the nanowire are different.

32. The method of connecting of claim 26, wherein the semiconductor device is formed on a semiconductor-on-insulator substrate comprising a semiconductor layer on an insulating layer, the semiconductor electrodes being formed in the semiconductor layer, the growing nanowire electrically connecting the electrodes.

33. A method of bridging semiconductor nanowires between a pair of spaced apart semiconductor electrodes of a device comprising:

growing semiconductor nanowires between opposing vertical surfaces of the spaced apart semiconductor electrode pair, the opposing surfaces being vertical relative to a horizontal surface of the device, the opposing vertical surfaces being activated with a nanoparticle catalyst and being (111) semiconductor lattice planes, the nanowires growing in opposing lateral directions to bridge between the vertical surfaces of the electrode pair.

34. The method of bridging of claim 33, wherein the nanowires are grown simultaneously from the opposing vertical surfaces to connect between the electrode pair.

35. The method of bridging of claim 33, wherein growing semiconductor nanowires comprises:

growing a primary semiconductor nanowire in a first lateral direction from a first opposing vertical surface of a first electrode of the electrode pair to a second opposing vertical surface of a second electrode of the electrode pair, the first vertical surface being primarily activated with a nanoparticle catalyst to grow the primary nanowire adjacent to the nanoparticle catalyst, the primary nanowire comprising the nanoparticle catalyst at a free end, the free end with the nanoparticle catalyst impinging on the second vertical surface.

36. The method of bridging of claim 35, wherein growing semiconductor nanowires further comprises:

growing a secondary semiconductor nanowire in a second lateral direction from the second vertical surface of the second electrode to the first vertical surface of the first electrode, the second vertical surface being activated by the nanoparticle catalyst from the impinged free end of the primary nanowire, the secondary nanowire growing adjacent the nanoparticle catalyst, a free end of the growing secondary nanowire comprising the nanoparticle catalyst, the free end of the secondary nanowire with the nanoparticle catalyst impinging on the first vertical surface, the second lateral direction being opposite the first lateral direction.

37. The method of bridging of claim 36, wherein growing semiconductor nanowires further comprises:
  growing a tertiary semiconductor nanowire in the first lateral direction from the first opposing vertical surface of the first electrode to the second opposing vertical surface of the second electrode, the tertiary nanowire growing adjacent the nanoparticle catalyst from impinged free end of the secondary nanowire, the tertiary nanowire comprising the nanoparticle catalyst at a free end, the free end of the tertiary nanowire with the nanoparticle catalyst impinging on the second vertical surface.

38. A method of self-assembling a nanowire between an electrically isolated semiconductor electrode pair of an electronic device comprising:
  depositing an activating catalyst on a vertical surface of a first electrode of the electrode pair, the vertical surface being a (111) semiconductor lattice plane, the electrode pair having opposing and spaced apart ones of the vertical surface, the activating catalyst comprising either a nanoparticle or a catalyst material, the catalyst material being annealed after depositing to form the nanoparticle on the vertical surface of the first electrode; and
  growing a semiconductor nanowire adjacent the nanoparticle, the nanowire growing laterally and having a free end, the free end comprising the nanoparticle from the first vertical surface;
  wherein growing comprises contacting the free end of the growing nanowire with the nanoparticle to the vertical surface of a second electrode, such that the laterally growing nanowire self-assembles to connect the electrode pair.

39. The method of self-assembling of claim 38, wherein the self-assembled nanowire provides one or both of an electrical connection and a mechanical connection between the electrode pair of the electronic device.

40. The method of self-assembling of claim 38, further comprising secondarily growing an additional nanowire from the second electrode vertical surface laterally to the first electrode vertical surface, the additional nanowire secondarily growing adjacent the nanoparticle from a point of impingement of the contacted end of the self-assembled nanowire.

41. The method of self-assembling of claim 38, wherein depositing comprises depositing the activating catalyst at an angle less than about 90° measured from a horizontal surface of the first electrode.

42. The method of self-assembling of claim 38, wherein before depositing an activating catalyst, further comprising:
  depositing a mask material on all surfaces of the device;
  selectively removing the mask material from horizontal surfaces of the device and electrodes to expose the horizontal surfaces;
  passivating the exposed horizontal surfaces; and
  removing the mask material from the vertical surfaces to expose the vertical surfaces for catalyst deposition.

43. The method of self-assembling of claim 38, wherein before depositing an activating catalyst, further comprising creating a surface irregularity in the vertical surface of the first electrode to control one or both of a position of the catalyst material on the vertical surface and nanowire growth from the vertical surface.

44. A method of controlling nanowire growth comprising:
  forming a trench in a horizontal surface of a substrate, the trench having vertical sidewalls, the sidewalls being (111) planes of a semiconductor lattice, the vertical sidewalls comprising an intentionally created surface irregularity;
  activating at least one of the vertical sidewalls with a nanoparticle catalyst; and
  growing a semiconductor nanowire adjacent the nanoparticle catalyst, wherein nanowire growth in an area of the surface inegularity differs from nanowire growth in other areas of the vertical sidewall.

45. The method of growing of claim 44, wherein forming a trench comprises intentionally misaligning an etch mask on the horizontal surface at an angle from the vertical (111) planes in the substrate; and etching the substrate to form the trench with the surface inegularity, the angle ranging from about 0.1° to about 45°.

46. The method of growing of claim 44, wherein the surface irregularity is a ledge created by intentionally misaligning an etch mask on the horizontal surface at an angle from the (111) planes during forming.

47. The method of growing of claim 46, wherein the ledge laterally steps along a different vertical (111) plane in the semiconductor lattice.

48. The method of controlling of claim 44, wherein one or more of a size and a density of the surface irregularity correlates to one or more of frequency of nanowire nucleation, density of nanowire growth and orientation of nanowire growth.

* * * * *

UNITED STATES PATENT AND TRADEMARK OFFICE
CERTIFICATE OF CORRECTION

PATENT NO. : 7,208,094 B2  
APPLICATION NO. : 10/738176  
DATED : April 24, 2007  
INVENTOR(S) : M. Saif Islam et al.

Page 1 of 1

It is certified that error appears in the above-identified patent and that said Letters Patent is hereby corrected as shown below:

In column 10, line 25, after "around the" delete "30".

In column 23, line 63, in Claim 6, delete "inegularity" and insert -- irregularity --, therefor.

In column 24, line 2, in Claim 8, delete "inegularity" and insert -- irregularity --, therefor.

In column 25, line 37, in Claim 22, delete "inegularity" and insert -- irregularity --, therefor.

In column 28, line 31, in Claim 44, delete "inegularity" and insert -- irregularity --, therefor.

In column 28, line 38, in Claim 45, delete "inegularity," and insert -- irregularity, --, therefor.

Signed and Sealed this

Sixth Day of October, 2009

David J. Kappos
*Director of the United States Patent and Trademark Office*